(12) United States Patent
Shizukuishi

(10) Patent No.: US 7,656,446 B2
(45) Date of Patent: Feb. 2, 2010

(54) CCD COLOR SOLID-STATE IMAGE PICKUP DEVICE

(75) Inventor: Makoto Shizukuishi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 979 days.

(21) Appl. No.: 10/796,149

(22) Filed: Mar. 10, 2004

(65) Prior Publication Data

US 2004/0179120 A1    Sep. 16, 2004

(30) Foreign Application Priority Data

Mar. 11, 2003    (JP) .............................. 2003-065616

(51) Int. Cl.
*H04N 5/335* (2006.01)
(52) U.S. Cl. ...................... 348/275; 348/272
(58) Field of Classification Search ................. 348/272, 348/274–280
See application file for complete search history.

(56) References Cited

U.S. PATENT DOCUMENTS

| | | | |
|---|---|---|---|
| 3,971,065 A | | 7/1976 | Bayer |
| 4,438,455 A | | 3/1984 | Tabei |
| 4,514,755 A | * | 4/1985 | Tabei .......................... 348/280 |
| 4,829,368 A | * | 5/1989 | Kobayashi et al. ........ 348/222.1 |
| 5,877,040 A | * | 3/1999 | Park et al. ...................... 438/70 |
| 5,965,875 A | | 10/1999 | Merrill |
| 6,236,434 B1 | | 5/2001 | Yamada |
| 6,535,249 B1 | * | 3/2003 | Stavely ........................ 348/340 |
| 6,750,911 B1 | * | 6/2004 | Kobayashi et al. ........... 348/272 |
| 6,930,336 B1 | * | 8/2005 | Merrill ......................... 348/272 |
| 7,132,724 B1 | * | 11/2006 | Merrill ......................... 257/440 |
| 7,164,444 B1 | * | 1/2007 | Merrill ......................... 348/308 |

FOREIGN PATENT DOCUMENTS

| | | |
|---|---|---|
| JP | 1-134966 A | 5/1989 |
| JP | 1-201953 A | 8/1989 |
| JP | 2-20068 A | 1/1990 |
| JP | 4-63473 A | 2/1992 |
| JP | 4-103169 A | 4/1992 |
| JP | 7-74340 A | 3/1995 |
| JP | 7-202156 A | 8/1995 |
| JP | 10-136391 A | 5/1998 |

OTHER PUBLICATIONS

"A Planar Silicon Photosensor with an Optimal Spectral Response for Detecting Printed Material" by Paul A. Gary and John G. Linvill; IEEE Transactions on Electron Devices; vol. ED-15, No. 1; pp. 30-39, Jan. 1968.
"A Progressive Scan CCD Image Sensor for DSC Applications" by Tetsuo Yamada et al.; IEEE Journal of Solid-State Circuits; vol. 35, No. 12; Dec. 2000; pp. 2044-2054.

* cited by examiner

*Primary Examiner*—Luong T Nguyen
(74) *Attorney, Agent, or Firm*—Birch, Stewart, Kolasch & Birch, LLP

(57) ABSTRACT

A CCD color solid-state image pickup device has a plurality of light-receiving sections arranged in an array on the surface of a semiconductor substrate, and a vertical transfer path by way of which signal electric charges stored in electric charge storage sections of the respective light-receiving sections are read and transferred to a horizontal transfer path. In the image pickup device, the electric charge-storage section of each of the light-receiving sections has a plurality of electric charge storage layers which are provided in a depthwise direction of the semiconductor substrate with potential barriers interposed therebetween. Signal electric charges stored in the respective electric charge storage layers are read independently to the vertical transfer path.

9 Claims, 18 Drawing Sheets

CROSS-SECTIONAL STRUCTURE OF SECTION FOR READING ELECTRIC CHARGES FROM PHOTODIODE ASSIGNED TO B WAVELENGTH

CROSS-SECTIONAL STRUCTURE OF SECTION FOR READING ELECTRIC CHARGES FROM PHOTODIODE ASSIGNED TO G WAVELENGTH

CROSS-SECTIONAL STRUCTURE OF SECTION FOR READING ELECTRIC CHARGES FROM PHOTODIODE ASSIGNED TO R WAVELENGTH

POTENTIAL IN DEPTHWISE DIRECTION OF
SUBSTRATE AND DISTANCE AT WHICH
WAVELENGTH OF INCIDENT LIGHT HAS ARRIVED

FIG. 11

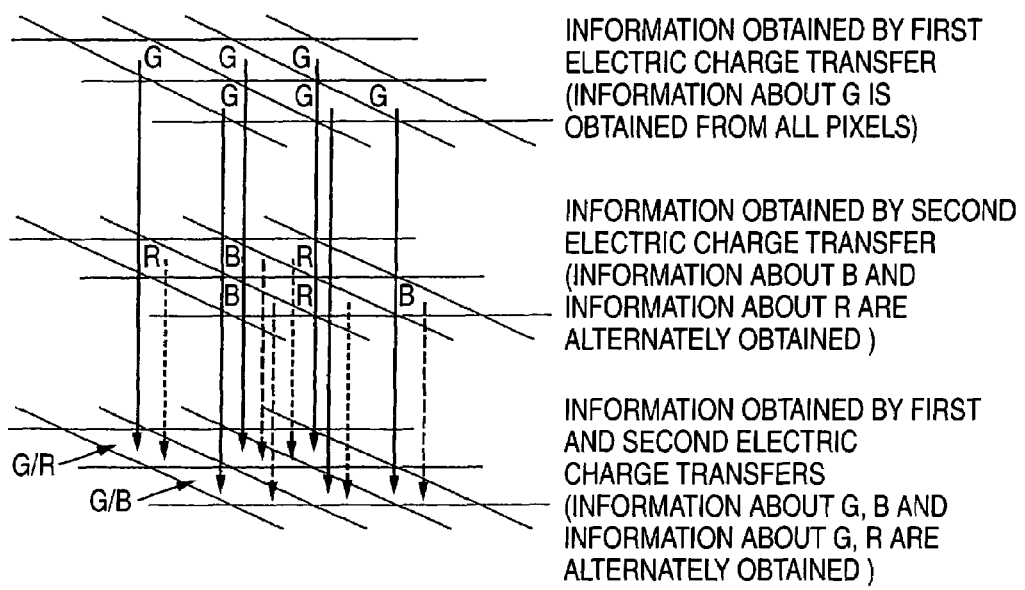

INFORMATION OBTAINED BY FIRST ELECTRIC CHARGE TRANSFER (INFORMATION ABOUT G IS OBTAINED FROM ALL PIXELS)

INFORMATION OBTAINED BY SECOND ELECTRIC CHARGE TRANSFER (INFORMATION ABOUT B AND INFORMATION ABOUT R ARE ALTERNATELY OBTAINED)

INFORMATION OBTAINED BY FIRST AND SECOND ELECTRIC CHARGE TRANSFERS (INFORMATION ABOUT G, B AND INFORMATION ABOUT G, R ARE ALTERNATELY OBTAINED)

FIG. 12

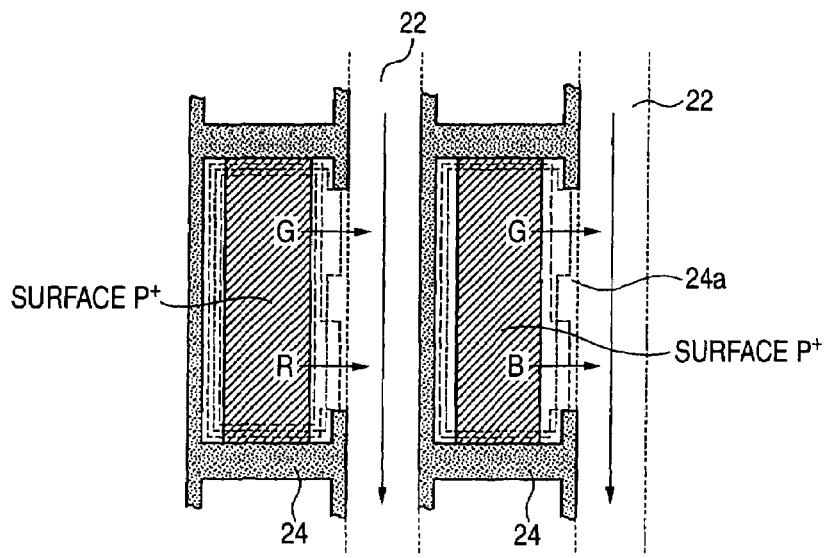

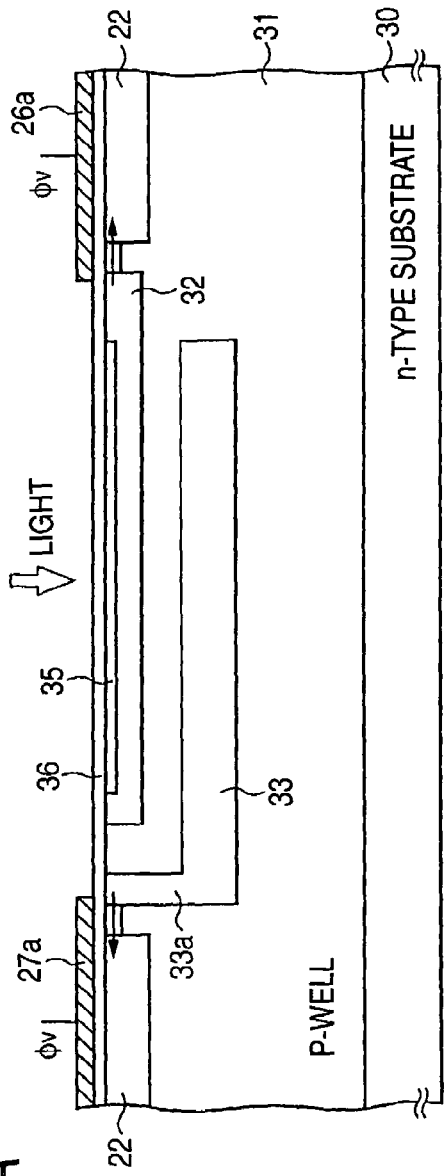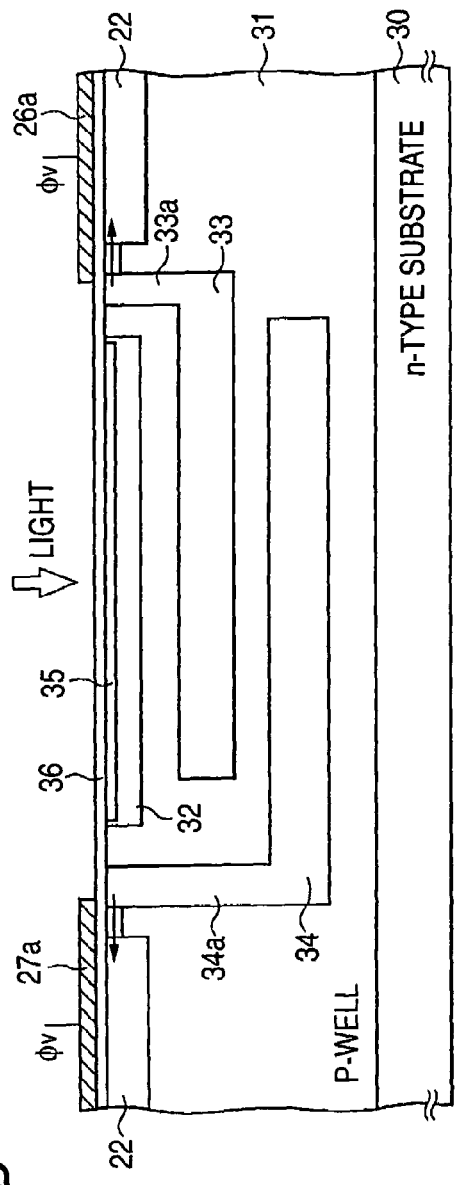
FIG. 14A
FIG. 14B

CCD COLOR SOLID-STATE IMAGE PICKUP DEVICE

This Nonprovisional application claims priority under 35 U.S.C. § 119(a) on Patent Application No(s). 2003-065616 filed in JAPAN on Mar. 11, 2003, the entire contents of which is hereby incorporated by reference.

BACKGROUND OF THE INVENTION

1. Field of the Invention

The present invention relates to a CCD (charge-coupled device) color solid-state image pickup device.

2. Description of the Related Art

In relation to a CCD semiconductor solid-state image pickup element and a CMOS semiconductor solid-state image pickup element, color filters having different spectral transmission coefficients are stacked on a plurality of photodiodes arranged in a two-dimensional array, thereby enabling pickup of a color image.

In the color filters [red (R), green (G), and blue (B)] of primary color system, for instance, a B filter primarily permits passage of only light having a short wavelength of 470 nm or less. Hence, a photodiode of a light-receiving section with the B filter stacked thereon has sensitivity to B incident light. However, the B filter blocks light having other wavelength components (e.g., G and R), and hence G and R wavelength components that have entered the B filter are not subjected to photoelectric conversion. Thus, color filters of this type suffer a problem of a failure to effectively utilize all wavelength components.

In contrast, in the case where the color filters of so-called complementary color system are used, for instance, a yellow (Ye) filter permits arrival of light of G and R wavelengths at a photodiode of a corresponding light-receiving section; a cyan (Cy) filter permits arrival of light of B and G wavelengths at a photodiode of a corresponding light-receiving section; and a magenta (Mg) filter permits arrival of light of B and R wavelengths at a photodiode of a corresponding light-receiving section. Hence, as compared with a case where color filters of primary color system are used, effective utilization of incident light and enhancement of sensitivity can be achieved.

However, a signal output from each photodiode of the solid-state image pickup device using the color filters of complementary color system includes a mixture of a plurality of color signals, such as G and R, B and G, and B and R. Hence, an external signal processing circuit must perform processing for separating the signal into R, G, and B color signals. Accordingly, there is a problem that an image photographed and reproduced by a solid-state image pickup device using color filters of complementary color system is usually inferior in quality to that photographed and reproduced by a solid-state image pickup device using color filters of primary color system, in terms of color reproducibility, signal noise, or the like. Therefore, a digital still camera which photographs a still image frequently employs a solid-state image pickup device using color filters of primary color system.

In the solid-state image pickup device, color filters of respective colors are discretely arranged in a two-dimensional plane. Hence, there is a problem of a false color or moiré arising at a spatial frequency which is equal to or higher than a so-called Nyquist limitation. To alleviate this problem, there has hitherto been adopted a method for increasing the number of pixels in a unit image pickup area or a consecutive photoconductive film in lieu of discrete arrangement of light-receiving sections.

In principle, the configuration for discretely arranging color filters having different spectral characteristics as described in U.S. Pat. No. 3,971,065, which will be described below, encounters difficulty in solving color moiré or a false color. Problems, such as color moiré and false colors, cannot be solved until sensitivity to R, G, B visible light wavelengths is achieved at the position of a single pixel and separate identification of the respective R, G, and B color components can be achieved.

For this reason, there has already been proposed a method for identifying color signal components while utilizing optical characteristics of a silicon substrate in place of use of the color filters. Specifically, there has been proposed an identification method utilizing the following characteristics. Namely, the light absorption coefficient of a silicon substrate changes across a visible range from light of long wavelength (R) to light of short wavelength (B). Therefore, light of a wavelength range having a large light absorption coefficient is absorbed by a shallow area of the silicon substrate, and hence the light hardly reaches a deep area of the silicon substrate. Conversely, light of a wavelength range having a small light absorption coefficient reaches a deep region of the silicon substrate. Therefore, photoelectric conversion can be performed even at the deep area of the silicon substrate.

"A Planar Silicon Photosensor with an Optimal Spectral Response for Detecting Printed Material" by Paul A. Gary and John G. Linvill, IEEE TRANSACTIONS ON ELECTRON DEVICES, Vol. ED-15, No. 1, Jan. 1968. (hereinafter referred to as "Publication 1") describes dependence of a photoelectric conversion characteristic of a photodiode on the depthwise position of a silicon substrate as well as on the wavelength of incident light.

An example of solid-state color imager comprised of three photo-sensitive layers, to which this idea has been applied is described in U.S. Pat. No. 4,438,455, which will be provided below.

The solid-state color imager with three photo-sensitive layers of U.S. Pat. No. 4,438,455 configured on the principle described in Publication 1 has a structure for extracting signals of three colors; i.e., R, G, and B. Without using color filters over-laid on the photo-sensitive elements, no light absorption of color filter material has arisen, and hence, incident light can be effectively converted into an electric signal.

As shown in FIG. 23 (corresponding to FIG. 3 of U.S. Pat. No. 4,438,455), U.S. Pat. No. 4,438,455 describes a structure 101 embodied by means of superimposing three photo-sensitive layers 102, 103, 104 and changing the depth of each photo-conductive layer against the incident light to apply the principle described in Publication 1 to the above structure.

The other example of CCD and MOS type solid-state color imager to which this idea has been applied is described in JP-A-1-134966, which will be provided below.

The solid-state color imager of JP-A-1-134966 configured on the principle described in Publication 1 has a structure of three story $N^+P$ photo-diode with different depth for extracting signals of three colors; i.e., R, G, and B, from one pixel. Without using color filters over-laid on the photo-diode elements, no light absorption of color filter material has arisen, and hence, incident light can be effectively converted into electric signal. Further, false signals or false colors, such as moiré, can be improved.

As shown in FIGS. 24A to 24C (corresponding to FIGS. 1(a) to 1(c) of JP-A-1-134966), JP-A-1-134966 describes a structure embodied by means of changing the depth of each $N^+P$ photo-diode to apply the principle described in Publication 1 to the above structure.

As shown in FIG. 24A, short wavelength light such as Blue is detected by the shallow N+P photo-diode 201. Long wavelength light such as Red is detected by the deep N+P photo-diode 203 as shown in FIG. 24C. The medium wavelength light such as Green is detected by the N+P photo-diode 202 locating in the depth of between the above two N+P photo-diodes as shown in FIG. 24B.

In the related-art interline CCD solid-state image pickup element, one reading gate section and one vertical transfer stage (one pixel is activated by three or four electrodes according to an all pixel reading method) are associated with one light-reading section. The area of the electric charge transfer path other than the light-receiving section is covered with a transfer-electrode. Therefore, no electrical contacts are provided in the light-receiving area, and no other peripheral circuits are provided for each pixel. Therefore, in the related-art CCD structure, signals corresponding to two or more different spectral sensitivities are read from one light-receiving section by utilization of a depthwise optical characteristic of the semiconductor substrate described in Publication 1. The signals cannot be subjected directly to charge transfer operation.

SUMMARY OF THE INVENTION

The present invention aims at providing a CCD color solid-state image pickup device capable of separately reading signal electric charges of a plurality of different colors from one pixel (light-receiving section) by utilization of a depthwise optical characteristic of a semiconductor substrate.

The present invention provides a CCD color solid-state image pickup device comprising: a plurality of light-receiving sections arranged in an array on the surface of a semiconductor substrate; and a vertical transfer path by way of which signal electric charges stored in electric charge storage sections of the respective light-receiving sections are read and transferred to a horizontal transfer path, wherein the electric charge storage section of each of the light-receiving sections has a plurality of electric charge storage layers which are provided in a depthwise direction of the semiconductor substrate with potential barriers interposed therebetween; and signal electric charges stored in the respective electric charge storage layers are read independently to the vertical transfer path.

By means of such a configuration, signal electric charges corresponding to incident light of different colors are stored in respective electric charge storage layers of one light-receiving section without use of color filters. Hence, incident light can be effectively utilized without placing a squeeze on the area of the light-receiving region and while lessening or eliminating moiré, a false signal, and a false color.

In the CCD color solid-state image pickup device of the invention, an electric charge path, which causes electric charges stored in the electric charge storage layers to migrate to the surface of the semiconductor substrate and is formed from a heavily-doped impurity region, may be provided in an electric charge storage layer from among the plurality of electric charge storage layers, the electric charge storage-layer being provided in the semiconductor substrate. By means of such a configuration, reading of signal electric charges from the respective electric charge storage layers is facilitated.

In the CCD color solid-state image pickup device of the invention, a concentration gradient may be imparted such that the dopant concentration of the electric charge storage layers formed as heavily-doped impurity regions and the dopant concentration of the electric charge path continually connected to the electric charge storage layer increase as the electric charge storage layer and the electric charge path approach the vertical transfer path. By means of such a configuration, reading of signal electric charges stored in the storage sections is facilitated, thereby preventing retention of unread signal electric charges.

In the CCD color solid-state image pickup device, the depths of the respective electric charge storage layers may be set in accordance with wavelengths of incident light to be detected. By means of such a configuration, spectral characteristics of the respective electric charge storage layers can be rendered as originally set.

The CCD color solid-state image pickup device of the invention may be arranged in a manner that three electric charge storage layers may be provided as the plurality of electric charge storage layers; an electric charge storage layer provided at the deepest location from among the three electric charge storage layers stores signal electric charges corresponding to red (R) incident light; an electric charge storage disposed in a surface section stores signal electric charges corresponding to blue (B) incident light; and an electric charge storage layer provided at an intermediate section stores signal electric charges corresponding to green (G) incident light. By means of such a configuration, three signals of the primary colors can be detected from one light-receiving section.

In the CCD color solid-state image pickup device of the present invention, the depth of the electric charge storage layer provided in the surface section may range from 0.2 to 0.4 μm; the depth of the electric charge storage layer provided in the intermediate section may range from 0.4 to 0.8 μm; and the depth of the electric charge storage layer provided in the deepest section may range from 0.8 to 2.5 μm. By means of such a configuration, the depths of the respective electric charge storage layers are made optimal for detecting R, G, and B incident light beams.

In the CCD color solid-state image pickup device of the present invention, a first light-receiving section for storing blue (B) and green (G) signal electric charges and a second light-receiving section for storing signal green (G) and red (R) signal electric charges may be alternately provided as the light-receiving sections on the surface of the semiconductor substrate; the first light-receiving section may be provided with a first electric charge storage layer for storing blue (B) signal electric charges and a second electric charge storage layer for storing green (G) signal electric charges; and the second light-receiving section may be provided with a second electric charge storage layer for storing green (G) signal electric charges and a third electric charge storage layer for storing red (R) signal electric charges. By means of such a configuration, signal electric charges can be detected on a per-color basis without color filters.

In the CCD color solid-state image pickup device of the present invention, the depth of the first electric charge storage layer may range from 0.2 to 0.4 μm; the depth of the second electric charge storage layer may range from 0.4 to 0.8 μm; and the depth of the third electric charge storage layer may range from 0.8 to 2.5 μm. By means of such a configuration, the respective electric charge storage layers are made optimal for detecting corresponding color signals.

In the CCD color solid-state image pickup device of the present invention, on-chip light gathering optical systems may be provided on upper portions of the respective light-receiving sections, and one opening of each light-shielding film may correspond to one of the light-receiving sections. By means of this configuration, even when the substantial area of the light-receiving section is enlarged to become double or triple, an essentially identical resolution is obtained for a given size of a CCD. Therefore, when an attempt is made to miniaturize the image pickup device or increase the number of pixels, information about all color components (R, G, and B) can be obtained independently from one pixel even under the same design rule and at the same pixel size. Therefore, occurrence of a loss in incident light is prevented, and occurrence of a false color is in principle prevented, thereby enhancing sensitivity and resolution.

In the CCD color solid-state image pickup device of the present invention, the light-receiving section may be provided with a first electric storage layer for storing blue (B) signal electric charges and a second electric charge storage layer for storing green (G) signal electric charges; and electric charges stored in the vertical transfer path may be used as signal electric charges corresponding to red (R) incident light. By means of such a configuration, a polysilicon electrode layer superimposed on the vertical transfer path absorbs light of a wavelength of 580 nm or less. An overlap existing between R and G, which is wavelength dependence of a spectral sensitivity, becomes smaller, thereby improving color reproducibility and image quality. In addition, the electric charge transfer path can be utilized as a photoelectric conversion area, and hence a high-sensitivity CCD solid-state image pickup device can be implemented without use of a microlens.

In the CCD color solid-state image pickup device of the present invention, the depth of the first electric charge storage layer may range from 0.2 to 0.4 μm; and the depth of the second electric charge storage layer may range from 0.4 to 0.8 μm. By means of such a configuration, the respective electric charge storage layers are made optimal for detecting corresponding color signals.

In the CCD color solid-state image pickup device of the present invention, the light-receiving sections may be arranged in a square grid pattern on the surface of the semiconductor substrate. In the CCD color solid-state image pickup device of the present invention, the light-receiving sections may be arranged in a honeycomb pattern on the surface of the semiconductor substrate. The present invention can be applied to any of these pixel arrangements.

BRIEF DESCRIPTION OF THE DRAWINGS

FIG. 11 is a descriptive view for reading signal electric charges from the color solid-state image pickup device of the second embodiment;

FIG. 12 is a plan view showing two unit pixels of the second embodiment and a vertical transfer path laid between the pixels;

FIG. 14A is a cross-sectional view taken along line a-a shown in FIG. 13;

FIG. 14B is a cross-sectional view taken along line b-b shown in FIG. 13;

DETAILED DESCRIPTION OF THE INVENTION

Embodiments of the present invention will be described hereinbelow by reference to the drawings.

First Embodiment

Figure 1:
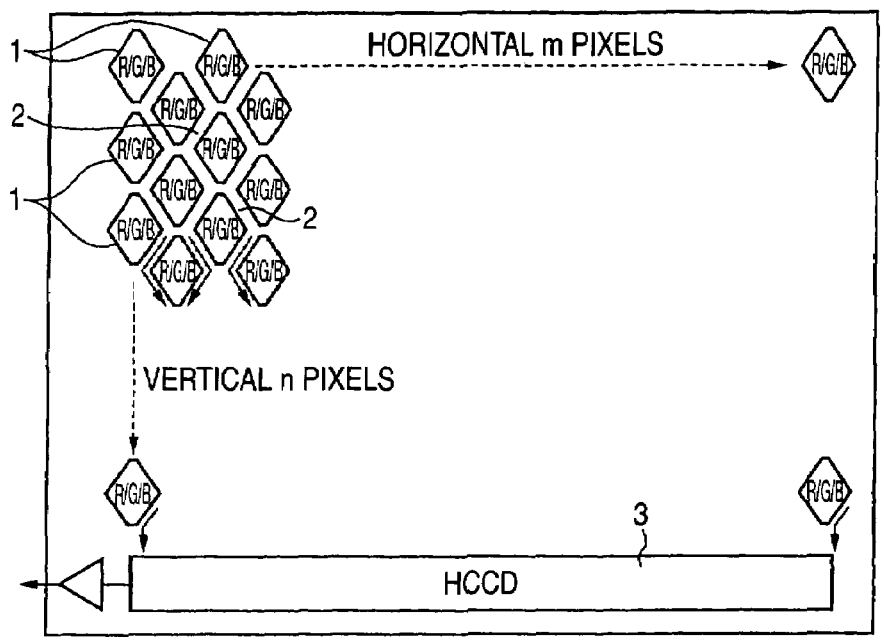
FIG. 1 is a schematic surface view of a CCD color solid-state image pickup device according to a first embodiment of the invention.

FIG. 1 is a schematic surface view of a CCD color solid-state image pickup device according to a first embodiment of the invention. In this CCD color solid-state image pickup device, a plurality of light-receiving sections 1 are arranged in an array on the surface of a semiconductor substrate. In an illustrated embodiment, each light-receiving section 1 is depicted as a rhombus and acts as a unit pixel.

The arrangement of pixels employed in the present embodiment corresponds to the arrangement of pixels described in JP-A-10-136391; that is, a so-called honeycomb pixel arrangement in which the respective light-receiving sections 1 are offset at half a pitch in both the vertical and horizontal directions. A vertical transfer path [e.g., a vertical charge-coupled device (VCCD)] 2 is formed between adjacent light-receiving sections 1, and signal electric charges read to the vertical transfer path 2 from the respective light-receiving sections 1 are downwardly transferred, in a meandering manner, to a horizontal transfer path [e.g., a horizontal charge-coupled device (HCCD)] 3.

As will be described later in detail, each light-receiving section 1 stores signal electric charges of three colors, i.e., red (R), green (G), and blue (B), and signal electric charges of the respective colors are read separately to the vertical transfer path 2. In FIG. 1, R/G/B is entered in each light-receiving section 1. However, this description shows that each unit pixel can subject any of R, G, and B wavelength components to photoelectric conversion and does not mean presence of a color-filter or another structure.

Figure 2:
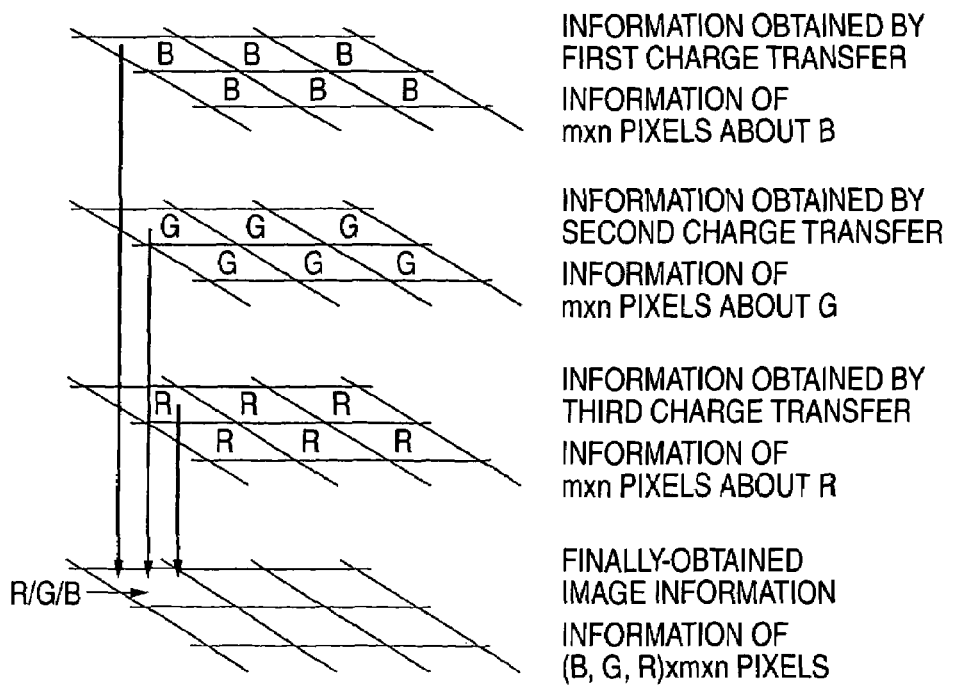
FIG. 2 is a descriptive view for reading signal electric charges from the color solid-state image pickup device of the first embodiment.

As shown in FIG. 2, color components; that is, R, G, and B, are sequentially read from each light-receiving section 1 in an amount corresponding to a total number of pixels; in other words, three surfaces (or three frames). The thus-read color components are subjected to signal processing performed by an external circuit, thereby outputting an image signal of a corresponding unit pixel.

Figure 3:
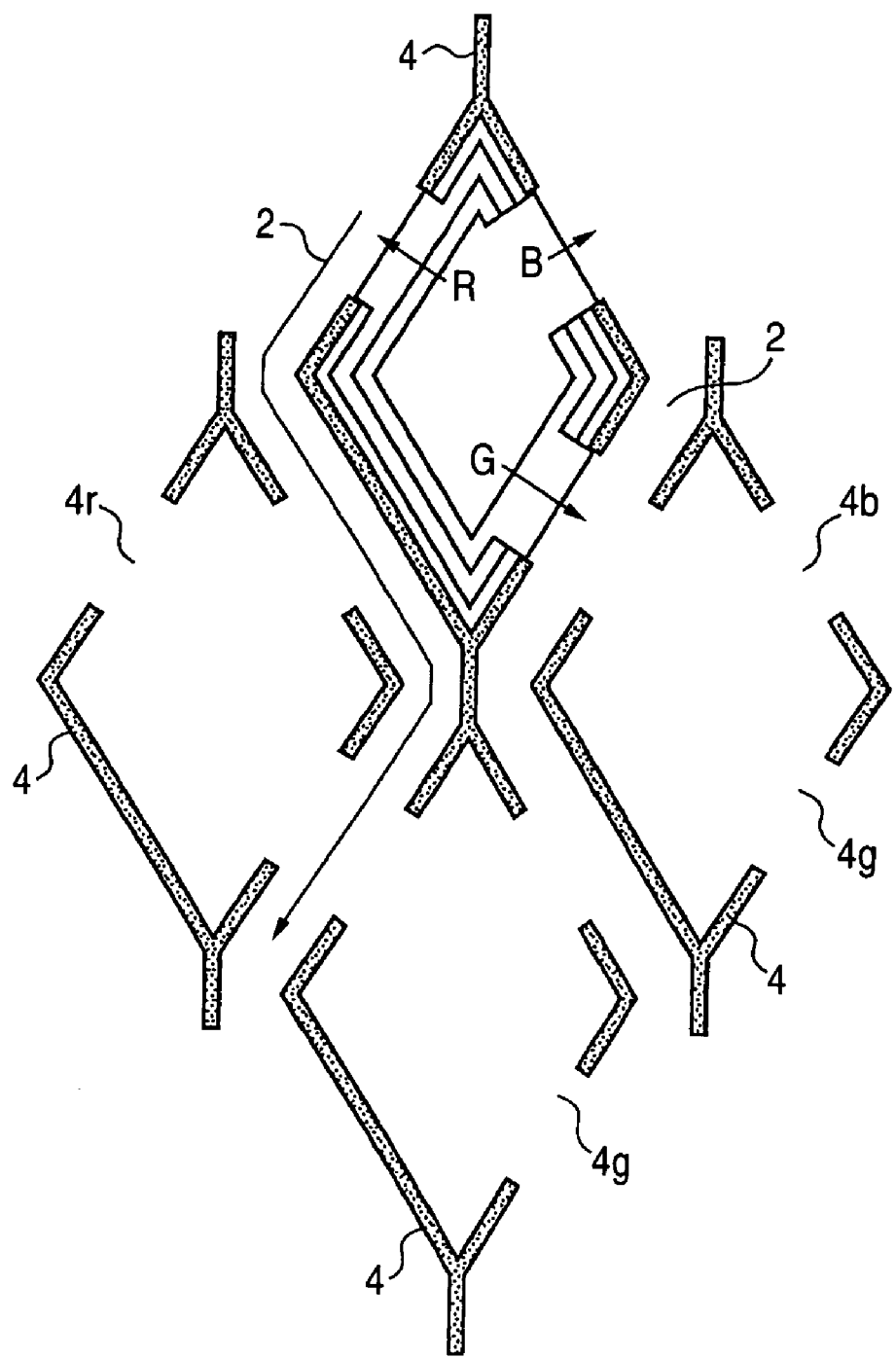
FIG. 3 is a plan view showing four pixels, each pixel corresponding to the light-receiving section shown in FIG. 1, and a detailed pattern of a vertical transfer path laid between the light-receiving sections.

FIG. 3 is a plan view showing four pixels, each pixel corresponding to one of the light-receiving sections 1 shown in FIG. 1, and a detailed pattern of a vertical transfer path 2 laid between the light-receiving sections 1. Each light-receiving section 1 is partitioned by a rhombus element isolation region 4. Of four sides of the rhombus, gate sections 4r, 4g, and 4b are formed in three sides where the element isolation region 4 is broken. An R signal electric charge is read from the gate section 4r to the vertical transfer path 2; a G signal electric charge is read from the gate section 4g to the vertical transfer path 2; and a B signal electric charge is read from the gate section 4b to the vertical transfer path 2.

Figure 4:
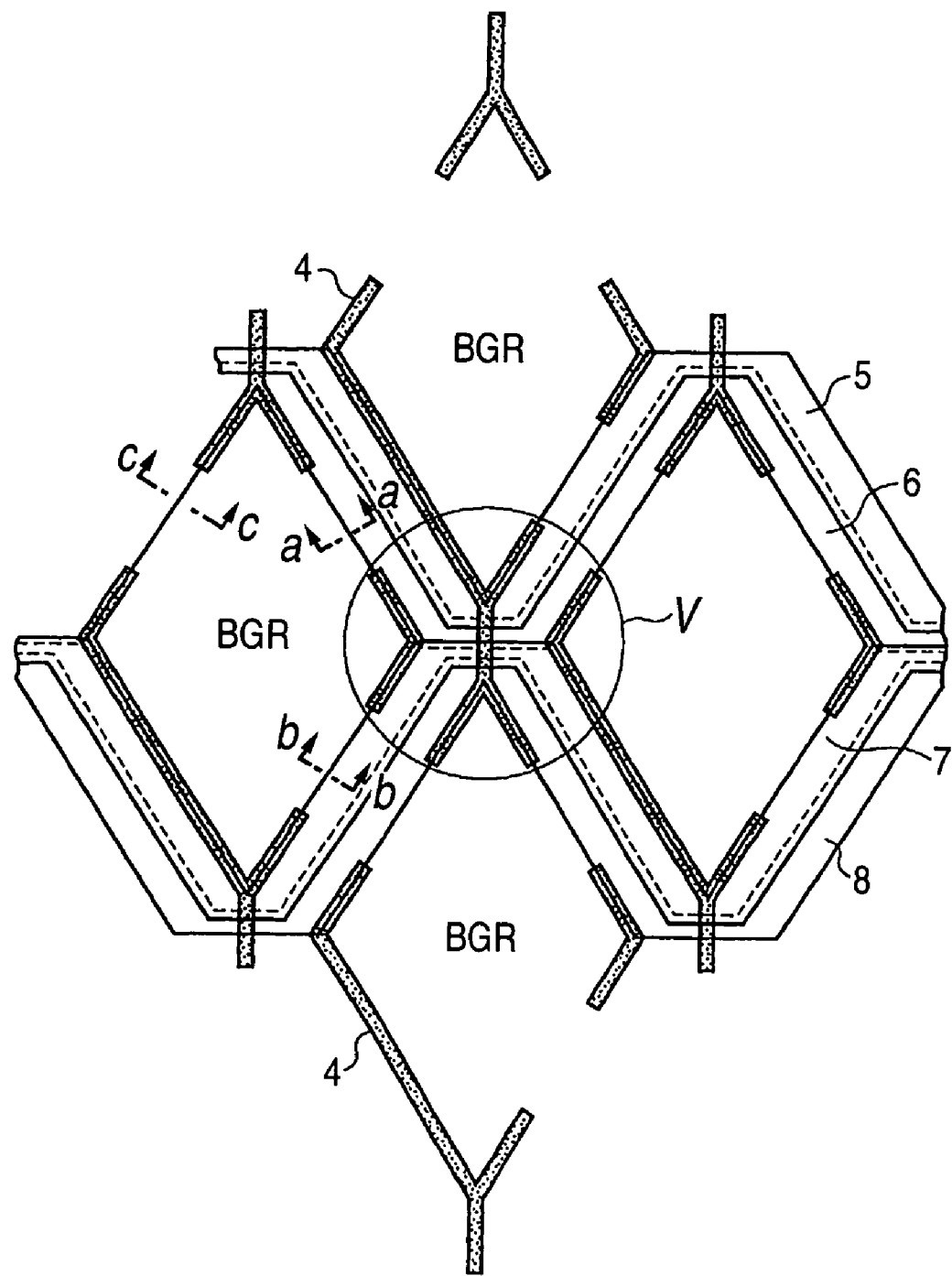
FIG. 4 is a view made by superimposing transfer electrodes on the pattern shown in FIG. 3.
Figure 5:
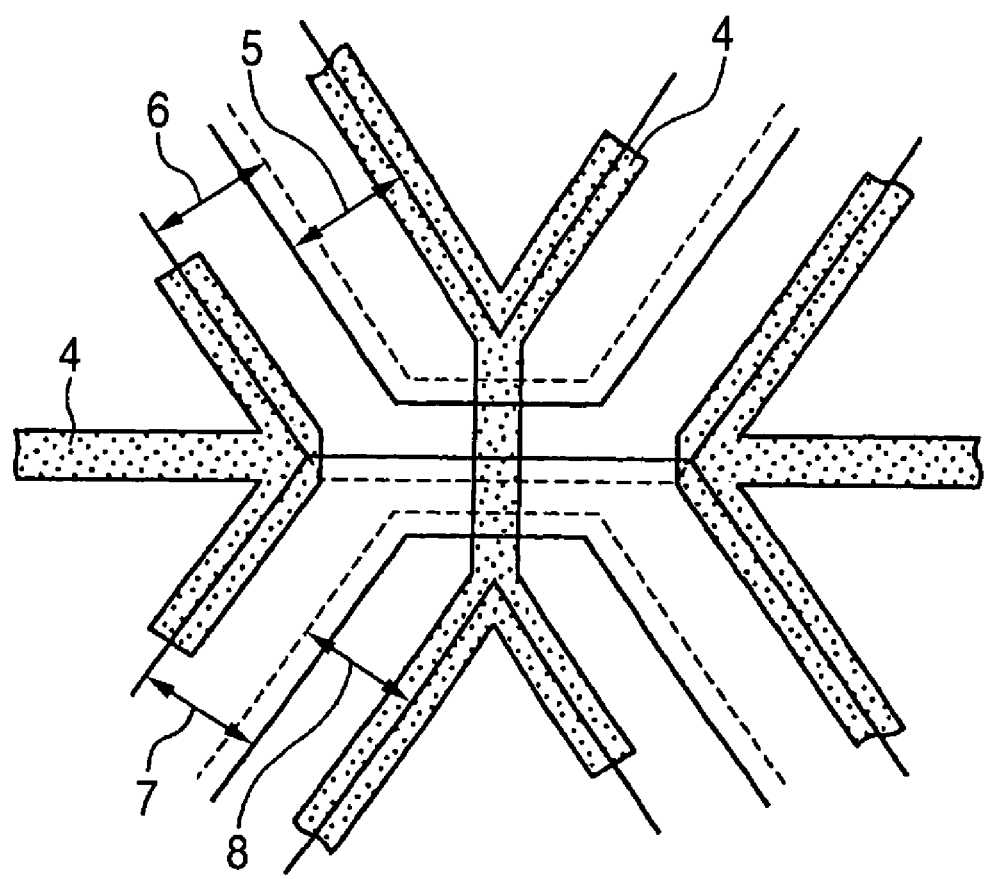
FIG. 5 is a detailed view of the inside of an area V enclosed by a circle shown in FIG. 4.

FIG. 4 is a view made by superimposing transfer electrodes on the pattern shown in FIG. 3. FIG. 5 is a detailed view of the inside of the area V enclosed by a circle shown in FIG. 4. A transfer electrode formed from a two-layer polysilicon structure is superposed on the vertical transfer path 2. Four transfer electrodes 5, 6, 7, and 8 are assigned to one light-receiving section 1. As a result, there is realized a CCD capable of performing a so-called all pixel reading operation (progressive operation).

Figure 6A:
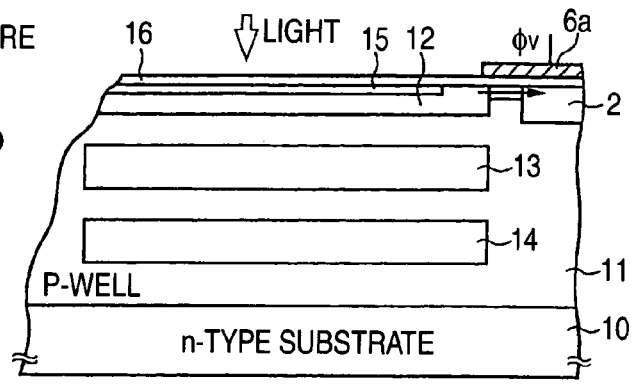
FIG. 6A is a cross-sectional view taken along line a-a shown in FIG. 4.
Figure 6B:
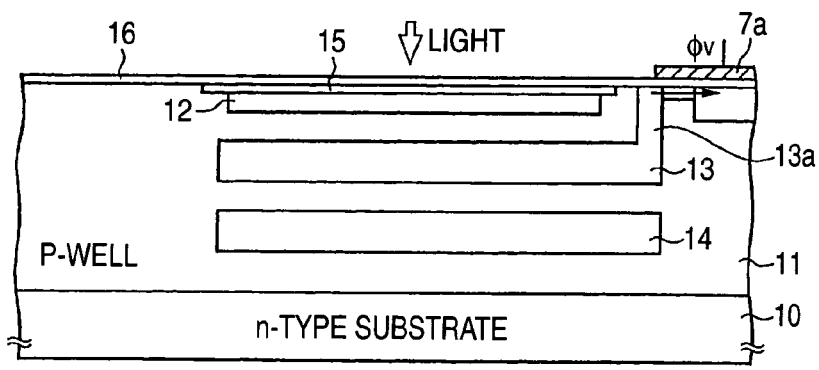
FIG. 6B is a cross-sectional view taken along line b-b shown in FIG. 4.
Figure 6C:
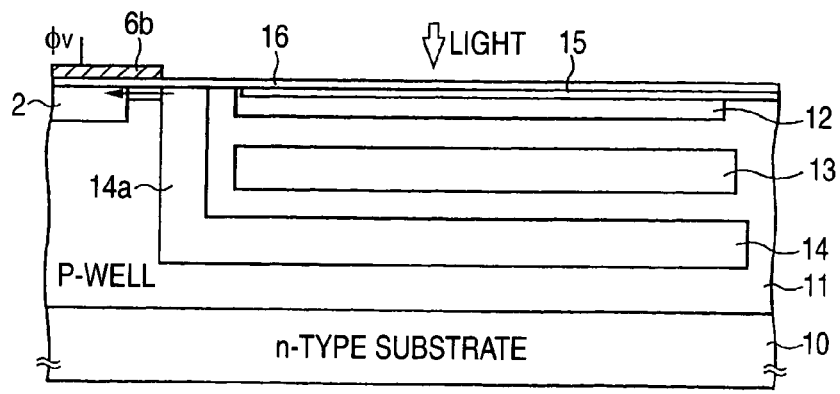
FIG. 6C is a cross-sectional view taken along line c-c shown in FIG. 4.

FIG. 6A is a cross-sectional view taken along line a-a shown in FIG. 4; FIG. 6B is a cross-sectional view taken along line b-b shown in FIG. 4; and FIG. 6C is a cross-sectional view taken along line c-c shown in FIG. 4. The CCD color solid-state image pickup device of the present embodiment is fabricated in an n-type semiconductor substrate 10. A P well layer 11 is formed in the surface of the semiconductor substrate 10. Three N$^+$ layers 12, 13, and 14 are formed within the P well layer 11 so as to be separated from each other in the depthwise direction of the substrate.

As shown in FIG. 6A, the N$^+$ layer 12 of the surface section extends up to a read gate electrode 6a formed from a portion of the transfer electrode. The signal electric charges primarily produced from an incident light component of short wavelength light (e.g., B) are stored in the N$^+$ layer 12 provided at the most shallow position with respect to the depthwise direction of the semiconductor substrate 10. The N$^+$ layer 12 {dopant [phosphorous or arsenic (P or As)] concentration is about $5\times10^{16-17}/cm^3$, and the depth of the N$^+$ layer is 0.2 to 0.4 μm, wherein the depth is dependent on the dopant concentration, and the same also applies to any counterparts in the following descriptions} constituting the signal electric charge storage section extends up to a position below a read gate section; that is, the read gate electrode 6a formed from a portion of the transfer electrode 6. As a result, only the electric charges derived primarily from the light of short wavelength pass through the gate section 4b shown in FIG. 3 and are read to the vertical transfer path 2.

As shown in FIG. 6B, an N$^+$ layer 13 provided at an intermediate position has, at an end section thereof, an N$^+$ region (i.e., a charge path) 13a which extends up to the surface of the semiconductor substrate 10. This N$^+$ region 13a extends up to a position below a read gate electrode 7a formed from a portion of the transfer electrode 7. The signal electric charges formed from light of intermediate wavelength (e.g., G) are stored in the N$^+$ layer 13. The N$^+$ layer 13 (dopant concentration is about $5\times10^{16-17}/cm^3$ at a depth of 0.4 to 0.8 μm) constituting the storage section extends up to a position below the read gate electrode 7a. As a result, the electric charges derived primarily from the light of intermediate wavelength (G) pass through the gate section 4g shown in FIG. 3 and are read to the vertical transfer path 2.

As shown in FIG. 6C, an N$^+$ layer 14 formed at the deepest position has, at an end section thereof, an N$^+$ region (i.e., a charge path) 14a which extends up to the surface of the semiconductor substrate 10. This N$^+$ region 14a extends up to a position below a read gate electrode 6b formed from a portion of the transfer electrode 6. The signal electric charges formed from light of long wavelength (e.g., R) are stored in the N$^+$ layer 14. The N$^+$ layer 14 (dopant concentration is about $5\times10^{16-17}/cm^3$ at a depth of 0.8 to 2.5 μm) constituting the storage section extends up to a position below the read gate section. As a result, the electric charges derived primarily from the light of a long wavelength (R) pass through the gate section 4r shown in FIG. 3 and are read to the vertical transfer path 2.

As mentioned above, the CCD color solid-state image pickup device of the embodiment has a three-layer storage section in the depthwise direction of the semiconductor substrate 10. Depths of the respective storage sections are determined such that the storage sections act as signal electric charge storage sections corresponding to light of B, G, and R colors in a sequence of increasing depth.

Figure 7:
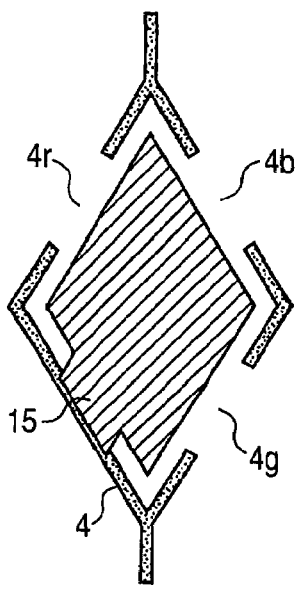
FIG. 7 is a view showing the range in which a surface $P^+$ layer is to be formed within the light-receiving section of the first embodiment.

As represented by one pixel shown in FIG. 7, a shallow P$^+$ layer 15 is provided in a portion of the surface of the semiconductor substrate 10 having the three-layer storage sections 12, 13, and 14. An SiO$_2$ film 16 is provided on top of the semiconductor substrate 10. Dopant (boron) concentration of the P$^+$ layer 15 is about $1\times10^{18}/cm^3$, and the depth of the P$^+$ layer 15 ranges from 0.1 to 0.2 μm or thereabouts. The dopant concentration contributes to a reduction in a defect level of an oxide film-semiconductor boundary surface. Accordingly, the storage section 12 located at the most shallow position in the depthwise direction of the semiconductor substrate 10 assumes a P$^+$N$^+$P structure.

As mentioned above, the CCD color solid-state image pickup device of the embodiment as a whole assumes a P$^+$ (N$^+$P) (N$^+$P) (N$^+$P) structure. Three storage sections (i.e., N$^+$ layers) are formed so as to be separated from each other with a P region (which is to become a potential barrier) being sandwiched therebetween in the depthwise direction of the substrate. The boron concentration of the P region located between the N$^+$ layers is set to $1\times10^{14-16}/cm^3$.

Preferably, the dopant concentration of the storage section (N$^+$ layer) is preferably given a concentration gradient so as to become higher toward the read gate section than at the light incidence region close to the center of the storage section. As a result, reading of the signal electric charges becomes easy, and retention of unread electric charges can be prevented.

Figure 8:
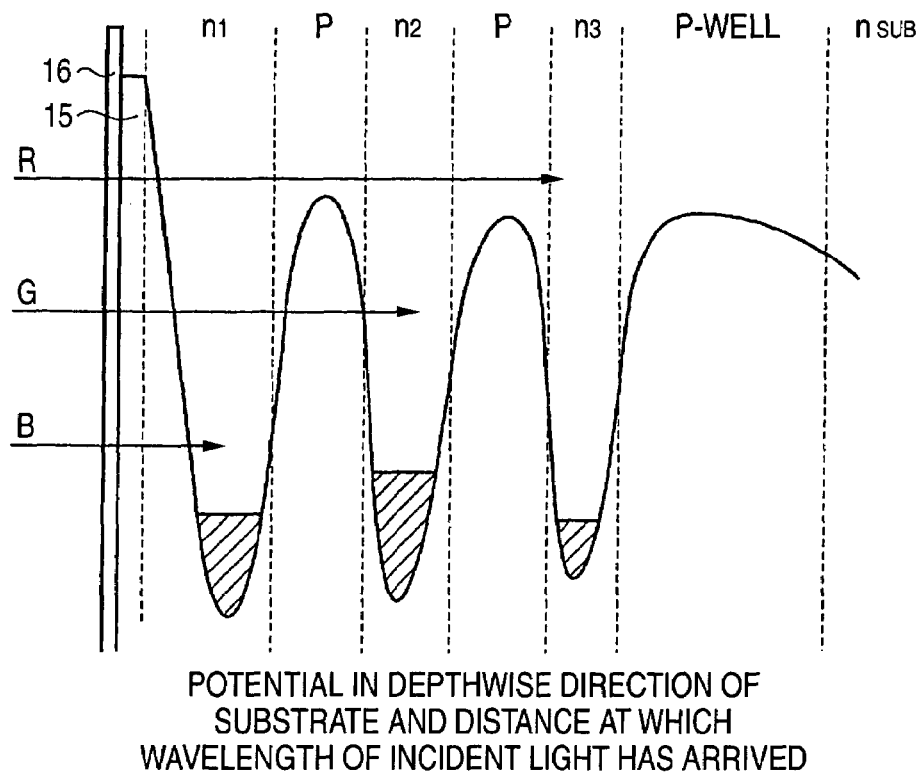
FIG. 8 is a view showing the potential profile of the light-receiving section of the first embodiment in the depthwise direction of the substrate.

FIG. 8 is a view showing the potential profile of the light-receiving section 1 in the depthwise direction of the substrate. Electric charges produced by light (B) of a short wavelength are chiefly stored in the most shallow electric charge storage section (i.e., the N$^+$ layer 12 indicated by "n1" in FIG. 8). Electric charges produced by light (G) of an intermediate wavelength are chiefly stored in the next shallow electric charge storage section (i.e., the N$^+$ layer 13 indicated by "n2" in FIG. 8). Electric charges produced by light (R) of a long wavelength are chiefly stored in the deepest electric charge storage section (i.e., the N$^+$ layer 14 indicated by "n3", in FIG. 8). The P region serving as a potential barrier exists between the electric charge storage sections n1 and n2 and between the electric charge storage sections n2 and n3. Signal charges (i.e., electrons) having developed in the P region are allocated to any of the adjacent charge storage sections (n1, n2, n3) along the potential profile.

Figure 9:
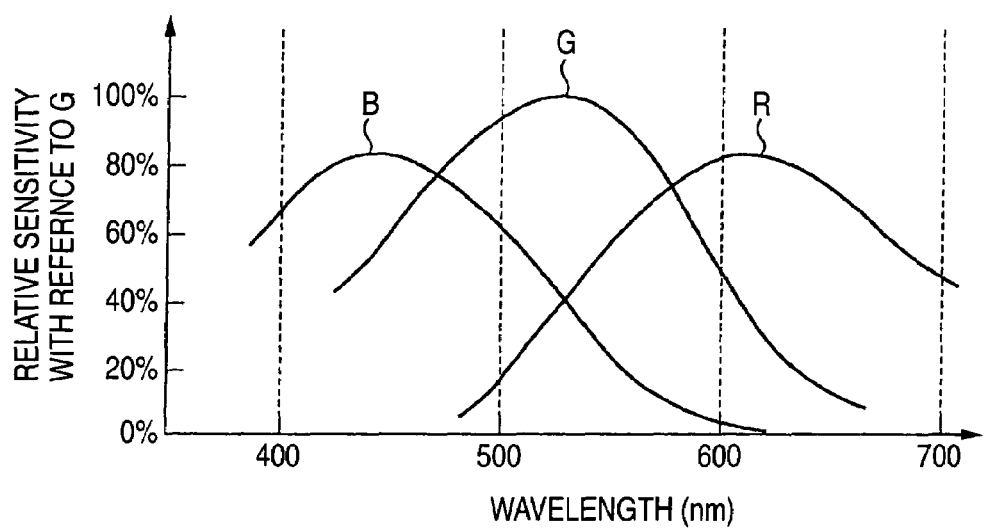
FIG. 9 is a view showing wavelength dependence of a photoelectric conversion characteristic of the light-receiving section of the first embodiment.

Moreover, the P well layer 11 and the n-type semiconductor substrate 10 are situated at positions further below the electric charge storage section 14. Hence, excessive electric charges, particularly, electric charges caused by light of a wavelength longer than R, flow toward the substrate. FIG. 9 is a view showing wavelength dependence of a photoelectric conversion characteristic of the light-receiving section 1 of the embodiment. R, G, and B spectral characteristics have characteristics depicted by separated peaks. The vertical axis represents relative sensitivity with reference to G.

As mentioned above, in the CCD color solid-state image pickup device of the embodiment, light of three colors, R, G, and B, is received by one unit pixel (i.e., the light-receiving section 1). Electric charges corresponding to respective colors can be stored, thereby obviating a necessity for use of color filters and enabling effective utilization of incident light. Further, three colors, R, G, and B, are independently, separately read. Hence, there is no necessity for addition of new contact sections, new signal lines, and other new peripheral circuits, except that the storage sections n1, n2, and n3 and paths for electric charges thereof are provided in the depthwise direction of the substrate and portions of the element isolation region laid around the light-receiving section are used as read gate sections. One unit pixel can read all the three colors R, G, and B, and hence the space between unit pixels can be reduced, thereby improving moiré, a false signal, and a false color.

Second Embodiment

Figure 10:
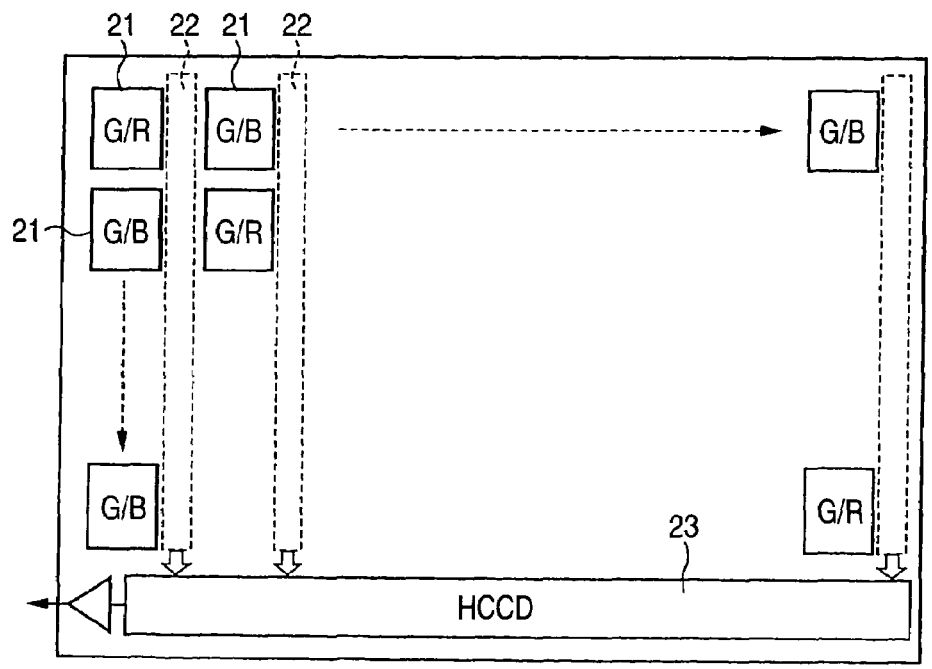
FIG. 10 is a schematic surface view of a CCD color solid-state image pickup device according to a second embodiment of the invention.

FIG. 10 is a schematic surface view of a CCD color solid-state image pickup device according to a second embodiment of the invention. In the drawing, a light-receiving section 21 is represented by a rectangle and taken as a unit pixel. A plurality of light-receiving sections 21 are arranged in an array pattern. In this embodiment, the light-receiving sections 21 are arranged in a square grid pattern. A vertical transfer path 22 is formed between horizontally-adjacent light-receiving sections 21. Signal charges read from the light-receiving section 21 to the vertical transfer path 22 are transferred to a horizontal transfer path 23 provided at a downward location. In the drawing, G/R and G/B are entered in each light-receiving section 21. However, these descriptions show that each unit pixel can subject R, G wavelength components and B, G wavelength components of the incident light to photoelectric conversion performed in the light-receiving section; the descriptions do not indicate presence of a color filter or another structure.

In the embodiment, the image pickup device has two kinds of light-receiving sections; that is, a light-receiving section capable of storing and reading G, R signal electric charges, and another light-receiving section capable of storing and reading G, B signal electric charges. These light-receiving sections are alternately arranged in both the vertical and horizontal directions. In the present embodiment, a G signal is produced from all the light-receiving sections 21. In relation to R, B signals, the R, B signals are alternately arranged in the form of a two-dimensional plane.

As shown in FIG. 11, in the CCD color solid-state image pickup device of the embodiment, G information corresponding to the total number of pixels (i.e., m×n pixels) is output by means of a first reading operation. Information corresponding to B and R, which are substantially equal in number and arranged alternately (i.e., m×n pixels), is output by means of a second reading operation. The thus-output information items are subjected to signal processing at corresponding pixel positions, thereby forming a color image.

FIG. 12 is a plan view showing two unit pixels (i.e., the light-receiving sections 21) of the embodiment and a vertical transfer path laid between the unit pixels. Each unit pixel is surrounded by a C-shaped element isolation region 24. Signal electric charges are read to the vertical transfer path 22 from a gate section 24a where the element isolation region 24 is not present.

Figure 13:
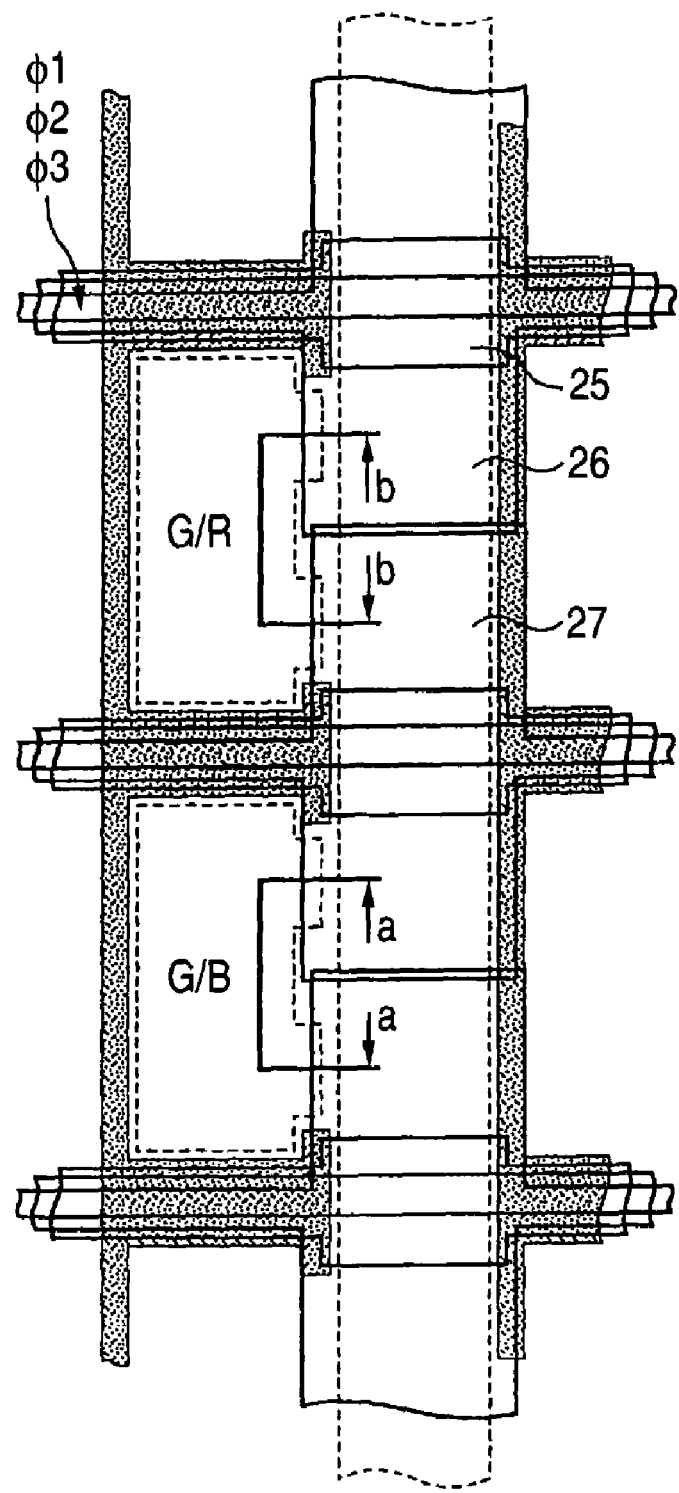
FIG. 13 is a view showing a transfer electrode of the color solid-state image pickup device of the second embodiment.

FIG. 13 is a view showing a transfer electrode of the color solid-state image pickup device of the embodiment. In the embodiment, transfer electrodes 25, 26, and 27 have a triple-layer polysilicon structure and are constituted of interline CCDs which can read all pixels. The second polysilicon electrode 26 and the third polysilicon electrode 27 constitute read gate electrodes, respectively. When a read voltage is applied to the respective read gate electrodes, a signal electric charge is read to the vertical transfer path 22 from a corresponding signal electric charge storage section.

FIG. 14A is a cross-sectional view taken along line a-a shown in FIG. 13; and FIG. 14B is a cross-sectional view taken along line b-b shown in FIG. 13. As mentioned previously, a color solid-state image pickup device of the present embodiment has G/B light-receiving sections and G/R light-receiving sections. FIG. 14A shows a cross-sectional structure of the G/B light-receiving section; and FIG. 14B shows a cross-sectional structure of the G/R light-receiving section.

In FIG. 14A, a P well layer 31 is formed in the surface of an n-type semiconductor substrate 30, and two N$^+$ layers 32, 33 are formed within the P well layer 31 so as to be separated from each other in the depthwise direction of the substrate.

The N$^+$ layer 32 {dopant [phosphorous or arsenic (P or As)] concentration is about $5 \times 10^{16-17}/cm^3$} located in the surface section extends up to a position below the read gate electrode 26a formed from a portion of the transfer electrode. As a result, the electric charges derived primarily from the light of short wavelength (e.g., B) are stored in the N$^+$ layer 32 provided at the most shallow position with respect to the depthwise direction of the semiconductor substrate 30. In this structure, the electric charges stored in the storage section 32; that is, only the electric charges produced primarily from light of a short wavelength, are read to the vertical transfer path 22.

A second N$^+$ layer 33 (dopant concentration is about $5 \times 10^{16-17}/cm^3$) has, at an end section thereof, an N$^+$ region (i.e., a charge path) 33a which extends up to the surface of the semiconductor substrate 30. The N$^+$ region 33a extends up to a position below a read gate electrode 27a formed from a portion of the transfer electrode. The signal electric charges formed from light of intermediate wavelength (e.g., G) are stored in the $N^+$ layer 33. In this structure, the electric charges stored in the storage section 33; that is, only the electric charges produced primarily from light of an intermediate wavelength (G), are read to the vertical transfer path 22.

In FIG. 14B, the P well layer 31 is formed in the surface of the n-type semiconductor substrate 30, and three $N^+$ layers 32, 33, and 34 are formed within the P well layer 31 so as to be separated from each other in the depthwise direction of the substrate.

The surface $N^+$ layer 32 is not used by the G/R light-receiving section. However, as in the case of the first embodiment, a shallow $P^+$ layer 35 is provided in the surface, and a $SiO_2$ film 36 is further provided in the topmost surface of the substrate, thereby diminishing a defect level of an oxide film-semiconductor boundary surface in the surface of the light-receiving section.

The second $N^+$ layer 33 (dopant concentration is about $5 \times 10^{16-17}/cm^3$) has, at an end section thereof, the $N^+$ region (i.e., a charge path) 33a which extends up to the surface of the semiconductor substrate 30. The $N^+$ region 33a extends up to a position below the read gate electrode formed from a portion of the transfer electrode. The signal electric charges formed from light of intermediate wavelength (e.g., G) are stored in the $N^+$ layer 33. In this structure, the electric charges stored in the storage section; that is, the electric charges produced primarily from light of an intermediate wavelength (G); are read to the vertical transfer path 22.

A third $N^+$ layer 34 formed in the deepest section has, at an end section thereof, the $N^+$ region (i.e., a charge path) 34a which extends up to the surface of the semiconductor substrate 30. The $N^+$ region 34a extends up to a position below the read gate electrode 27a formed from a portion of the transfer electrode. The signal electric charges formed from light of a long wavelength (e.g., R) are stored in the $N^+$ layer 34. As a result of the $N^+$ layer 34 (dopant concentration is about $5 \times 10^{16-17}/cm^3$), which constitutes the storage section, extending up to a position located below the read gate, the electric charges produced primarily from light of a long wavelength (R) are read to the vertical transfer path 22.

The G/R light-receiving section does not detect signal electric charges produced by the light (B) of a short wavelength as a signal. Hence, there is no necessity for reading electric charges from the first $N^+$ layer 32 located at the most shallow position with respect to the depth wise direction of the substrate. Since the electric charges stored in the $N^+$ layer 32 are no necessary, the electric charges are withdrawn to the outside from the substrate 30 by application of a bias voltage to the substrate 30.

The G/B light-receiving section does not detect as a signal electric charges produced by the light (R) of a long wavelength. In the illustrated embodiment, the $N^+$ layer 34 for detecting R signal electric charges is not formed. However, the $N^+$ layer 34 may be formed but arranged not to read electric charges stored therein.

As mentioned above, according to the embodiment, two or three layers of signal electric charge storage sections are provided in the depthwise direction of the semiconductor substrate. Hence, signal electric charges corresponding the quantity of respective R, G, and B light can be stored and read separately, thereby enabling effective utilization of incident light.

Figure 15A:
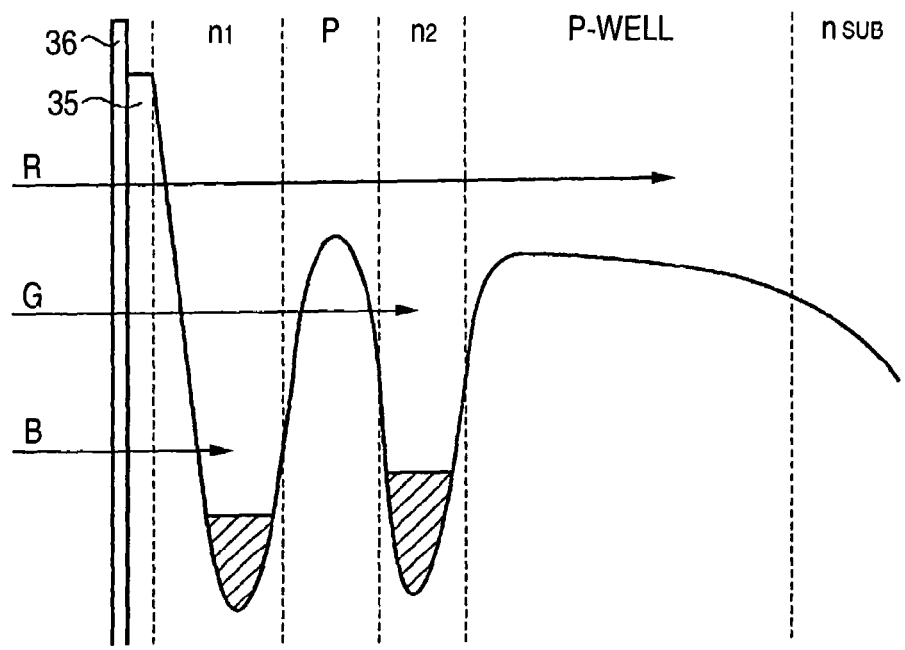
FIG. 15A is a view showing the potential profile of the light-receiving section shown in FIG. 14A in the depthwise direction of the substrate.
Figure 15B:
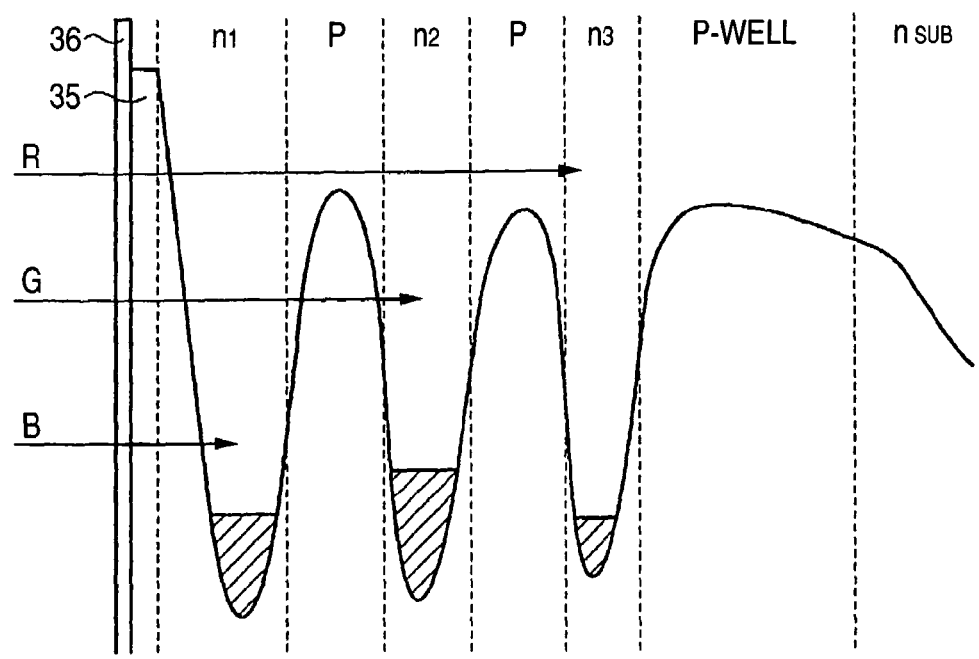
FIG. 15B is a view showing the potential profile of the light-receiving section shown in FIG. 14B in the depthwise direction of the substrate.

FIG. 15A is a view showing the potential profile of the G/B light-receiving section of the embodiment in the depthwise direction of the substrate. FIG. 15B is a view showing the potential profile of the G/R light-receiving section of the embodiment in the depthwise direction of the substrate. Electric charges produced by light (B) of a short wavelength are chiefly stored in the most shallow electric charge storage section (i.e., the $N^+$ layer 32 indicated by "n1" in FIG. 15). Electric charges produced by light (G) of an intermediate wavelength are chiefly stored in the next shallow electric charge storage section (i.e., the $N^+$ layer 33 indicated by "n2" in FIG. 15). Electric charges produced by light (R) of a long wavelength are chiefly stored in the deepest electric charge storage section (i.e., the $N^+$ layer 34 indicated by "n3" in FIG. 15).

Moreover, the P well layer 31 and the n-type semiconductor substrate 30 are situated at positions further below the deepest electric charge storage section. Hence, excessive electric charges, particularly, electric charges caused by light of a wavelength longer than R, flow toward the substrate. Wavelength dependence of a photoelectric conversion characteristic of the color solid-state image pickup device of the embodiment is identical with that shown in FIG. 9 in connection with the first embodiment.

In FIG. 15A, the storage section n3 corresponding to R is not formed, and hence a corresponding potential well is not present. In FIG. 15B, a storage section corresponding to the storage section n1; that is, B, is formed. However, stored electric charges are not read to the vertical transfer path. Hence, after reading of signal electric charges of the storage sections associated with G and R, a high voltage is applied to the substrate 30, thereby withdrawing the electric charges stored in the storage section n1 until the storage section n1 enters an initial state (i.e., an empty state).

Third Embodiment

Figure 16:
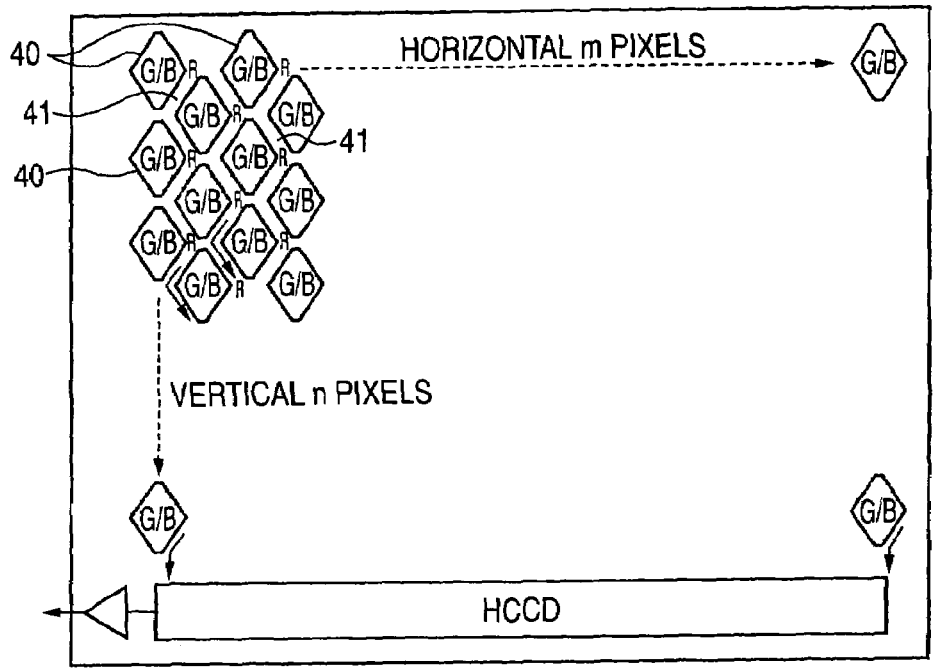
FIG. 16 is a schematic surface view of a CCD color solid-state image pickup device according to a third embodiment of the invention.

FIG. 16 is a schematic surface view of a CCD color solid-state image pickup device according to a third embodiment of the invention. The basic configuration of the present embodiment is analogous to that of the first embodiment. In contrast with the first embodiment in which the light-receiving section 10 detects signal electric charges of three colors; that is, R, G and B, the present embodiment differs in that a light-receiving section 40 of the present embodiment detects signal electric charges of two colors; that is, G and B and that a vertical-transfer path 41 per se is utilized as an R light receiving region. Here, the concept for utilizing the vertical transfer path 41 as a region for receiving light of a long wavelength (R) has already been known as described in, e.g., Japanese Patent No. 2534105.

Figure 17:
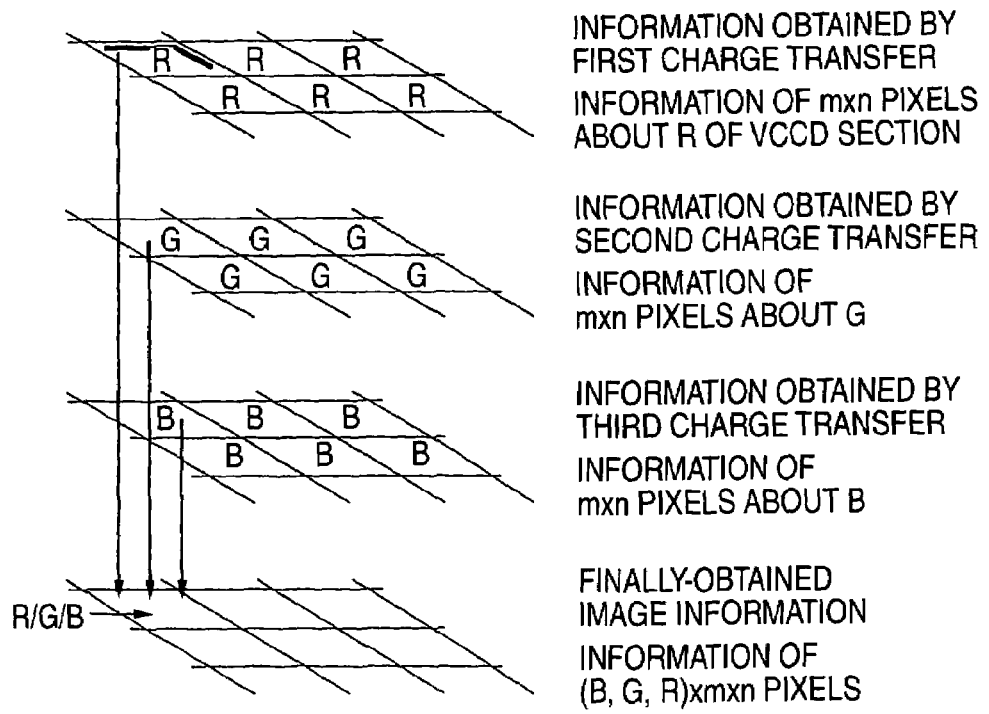
FIG. 17 is a descriptive view for reading signal electric charges from the color solid-state image pickup device of the third embodiment.

In the embodiment, the vertical transfer path 41 is used as a light-receiving region for receiving light of a long wavelength (R). The original light-receiving section 40 can be configured to output information about B and G. More specifically, as shown in FIG. 17, only light of a long wavelength (R) of the light having entered the vertical transfer path passes through a transfer electrode layer formed from polysilicon and then reaches the silicon substrate, thereby producing electric charges within the vertical transfer path. First, the thus-produced electric charges are transferred vertically and read. The signal serves as data corresponding to a total number of pixels (m×n) concerning R.

As in the case of the first and second embodiments, the signal electric charges pertaining to G and B are read from the light-receiving section. The thus-read electric charges are twice transferred vertically and horizontally, to thereby produce signal data. Finally, the R, G, and B signals are subjected to signal processing as single pixel position information.

Figure 18:
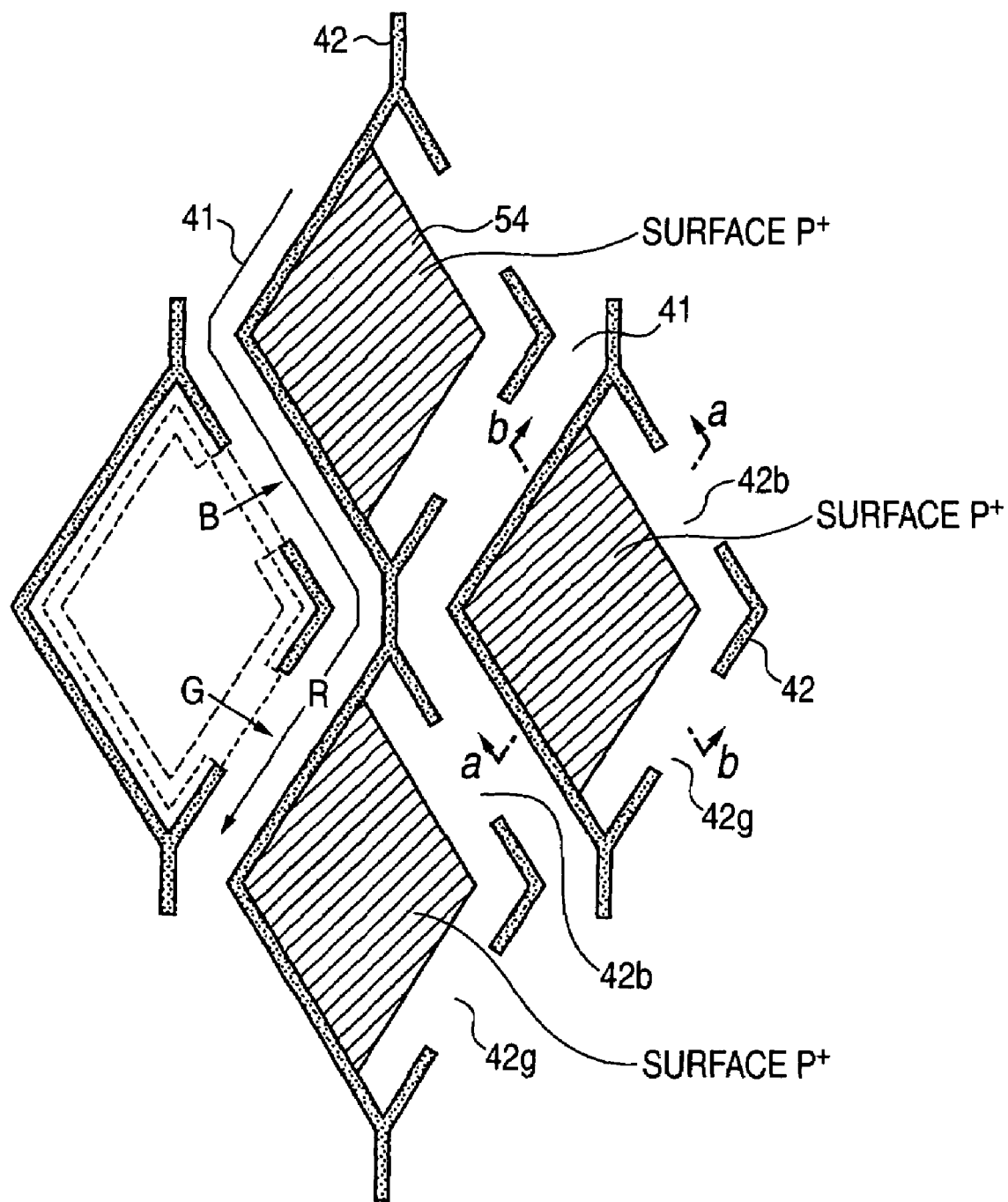
FIG. 18 is a plan view of four pixels of the color solid-state image pickup device of the third embodiment.

FIG. 18 is a plan view of four pixels of a color solid-state image pickup device of the embodiment. The respective light-receiving sections 40 of the embodiment are partitioned by rhombus element isolation regions 42. Of four sides of the rhombus, gate sections 42g, 42b are formed in two right sides of the element isolation region 42. A G signal electric charge is read to the vertical transfer path 41 by way of the gate section 42g, and a B signal electric charge is read to the vertical transfer path 41 by way of the gate section 42b.

Figure 19A:
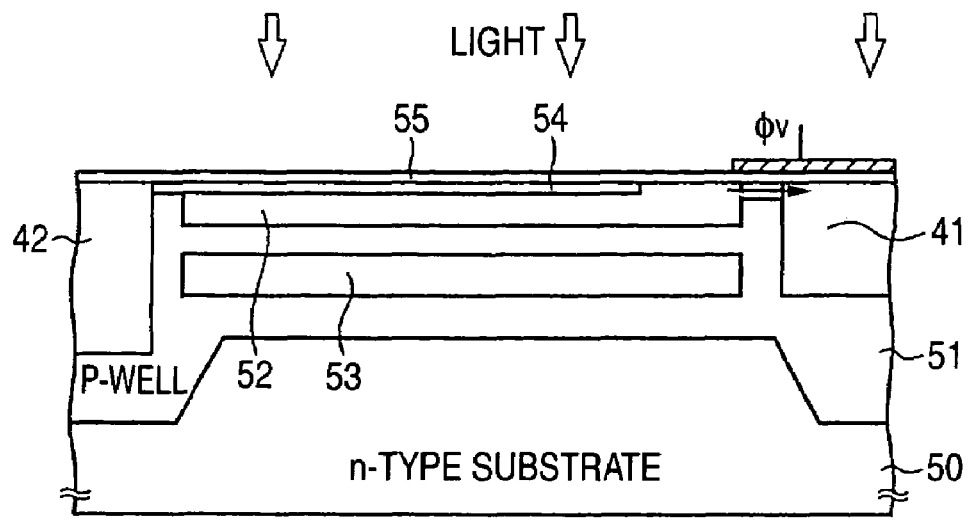
FIG. 19A is a cross-sectional view taken along line a-a shown in FIG. 18.
Figure 19B:
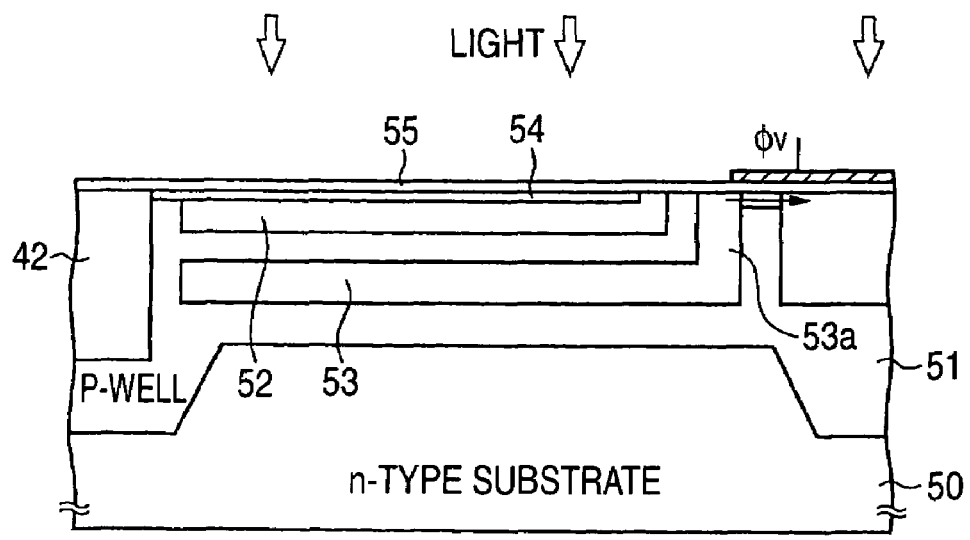
FIG. 19B is a cross-sectional view taken, along line b-b shown in FIG. 18.

FIG. 19A is a cross-sectional view taken along line a-a shown in FIG. 18; and FIG. 19B is a cross-sectional view taken along line b-b shown in FIG. 18. A P well layer 51 is formed in the surface of an n-type semiconductor substrate 50, and two $N^+$ layers 52, 53 are formed within the P well layer 51 in a separated manner. A shallow $P^+$ layer 54 is formed in the surface of the $N^+$ layer 52 located in the surface part of the substrate. An $SiO_2$ film 55 is formed at the outermost surface of the substrate.

One end of an $N^+$ layer 52 extends up to a location located below a read gate electrode. One end of an $N^+$ layer 53 also extends up to the surface of the semiconductor substrate 50 by means of an $N^+$ region (electric charge path) 53a and extends to a position located below the read gate electrode. Depths of the $N^+$ layers are determined such that signal electric charges corresponding to B incident light are stored in the shallow $N^+$ layer 52 and such that signal electric charges corresponding to G incident light are stored in the $N^+$ layer 53 located below the $N^+$ layer 52.

In the embodiment, a storage section assigned to light of a long wavelength (R) is not necessary. Therefore, the third $N^+$ layer provided in the first and second embodiments is not provided. As a result, processes for forming storage sections, such as an ion injection process, are simplified. Moreover, reading of electric charges from a storage section having a deep dopant distribution is not necessary. Hence, there is yielded an advantage of the ability to enable a reduction in reading voltage and high-speed driving.

Figure 20:
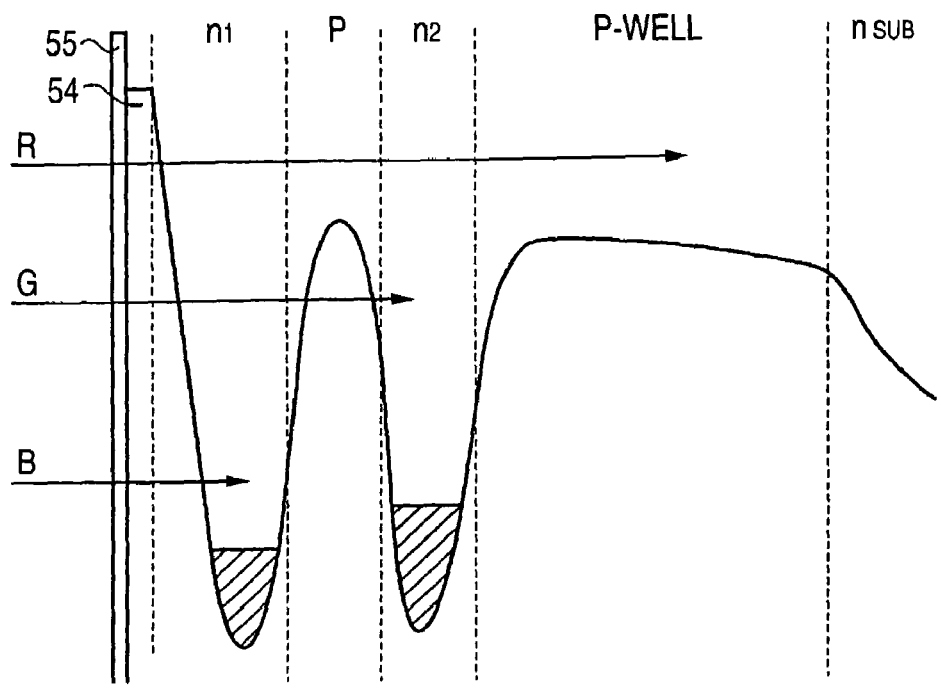
FIG. 20 is a view showing the potential profile of the light-receiving section of the third embodiment in the depth-wise direction of the substrate.

FIG. 20 is a view showing the potential profile of the light-receiving section 40 of the embodiment in the depthwise direction of the substrate. Electric charges produced by light (B) of a short wavelength are chiefly stored in the most shallow electric charge storage section (i.e., the $N^+$ layer 52 indicated by "n1" in FIG. 20). Electric charges produced by light (G) of an intermediate wavelength are chiefly stored in the next shallow electric charge storage section (i.e., the $N^+$ layer 53 indicated by "n2" in FIG. 20). The P well layer 51 and the n-type substrate 50 are located below the electric charge storage sections, and hence excessive electric charges, particularly, electric charges caused by light of a wavelength longer than G, flow toward the substrate.

Figure 21:
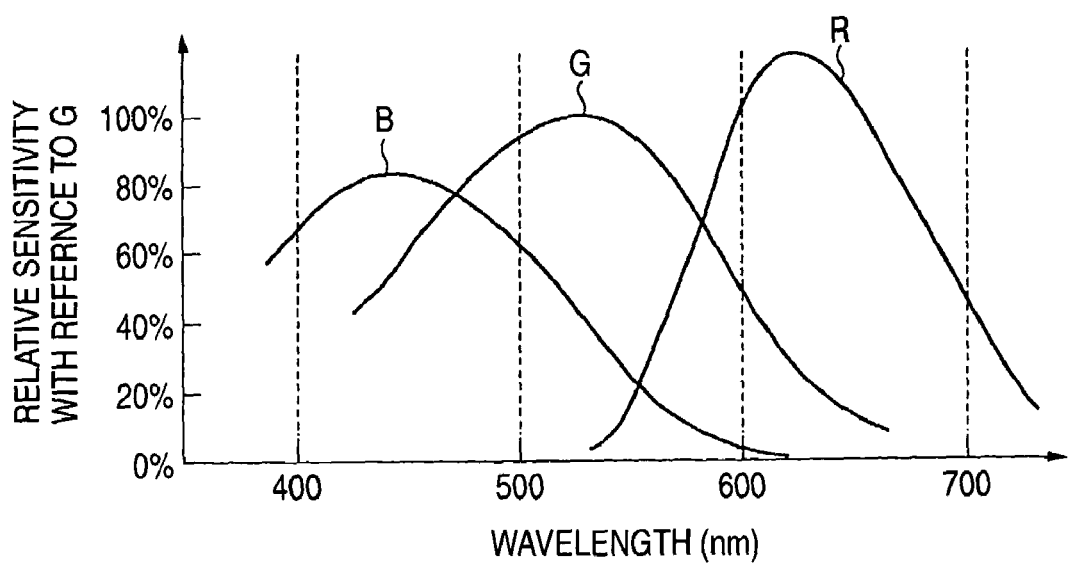
FIG. 21 is a view showing wavelength dependence of a photoelectric conversion characteristic of the light-receiving section of the third embodiment.

FIG. 21 is a view showing wavelength dependence of a photoelectric conversion characteristic of the light-receiving section of the embodiment. B and G are substantially identical with those shown in FIG. 9. However, when compared with its counterpart shown in FIG. 9, R has become larger. Further, R is understood to have a large attenuation in the wavelength shorter than 580 nm or thereabouts. The reason for this is that a polysilicon electrode is present in the vertical transfer path imparted with sensitivity to R. This electrode absorbs light of a wavelength of 580 nm or less, thereby reducing the potential of contribution to generation of electric charges. Consequently, an overlap between R and G becomes smaller, thereby improving color reproducibility and enhancing image quality to a much greater extent.

Fourth Embodiment

Figure 22:
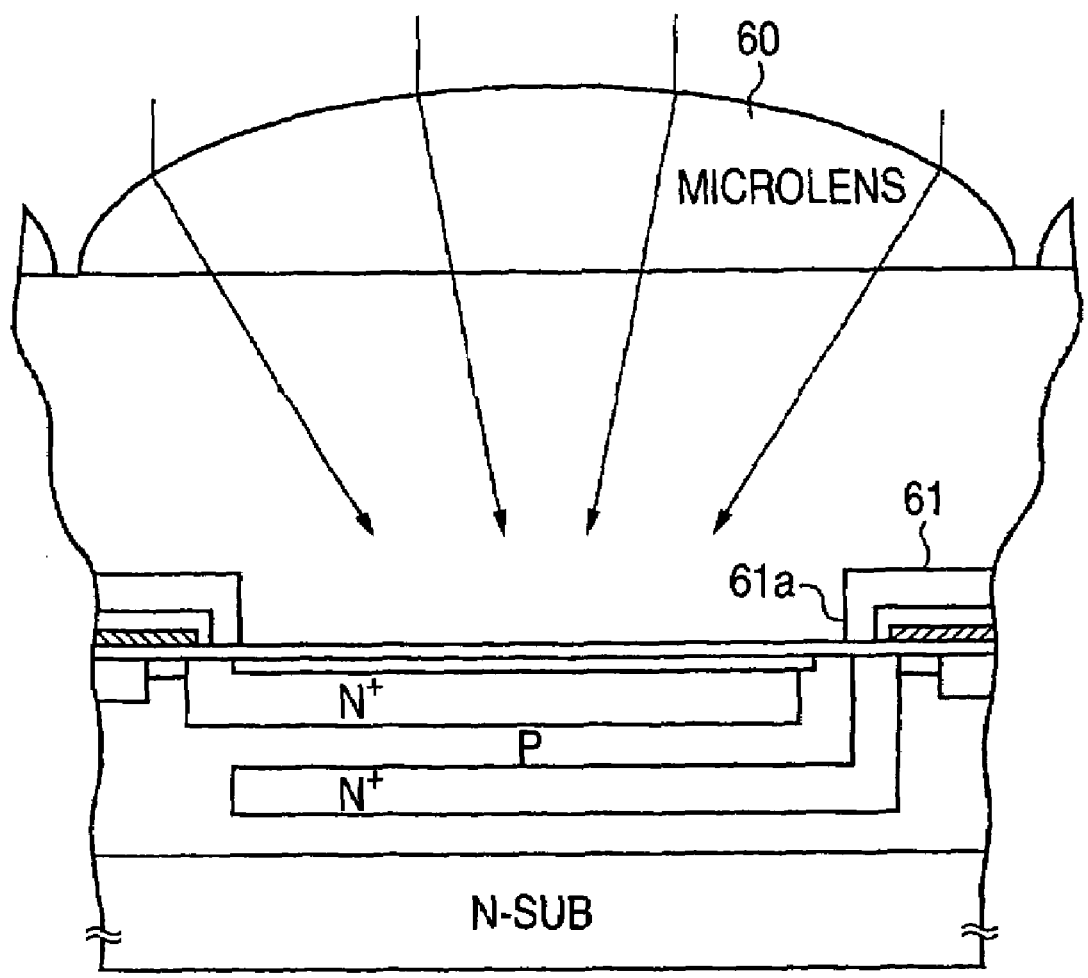
FIG. 22 is a cross-sectional view of one unit pixel (light-receiving section) of a color solid-state image pickup device according to a fourth embodiment of the invention.
Figure 23:
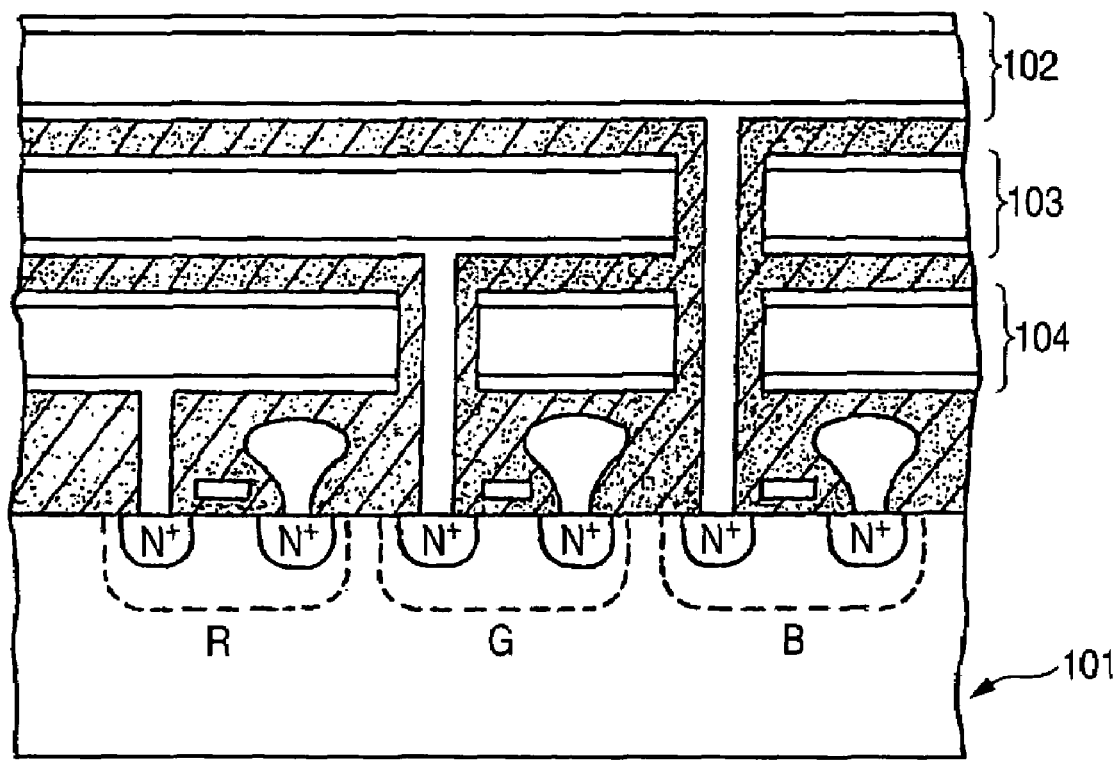
FIG. 23 is a descriptive view of a related-art color solid-state image pickup device.
Figure 24A:
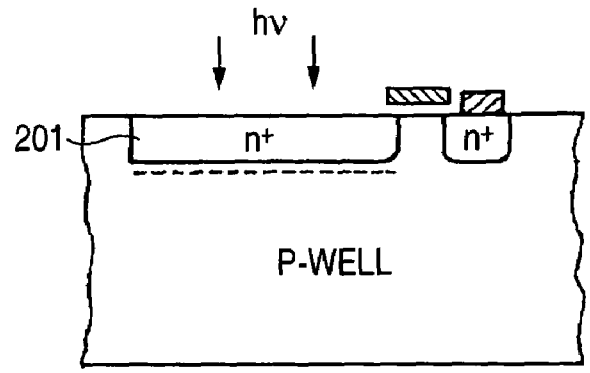
FIGS. 24A to 24C are descriptive views of a related-art color solid-state image pickup device.
Figure 24B:
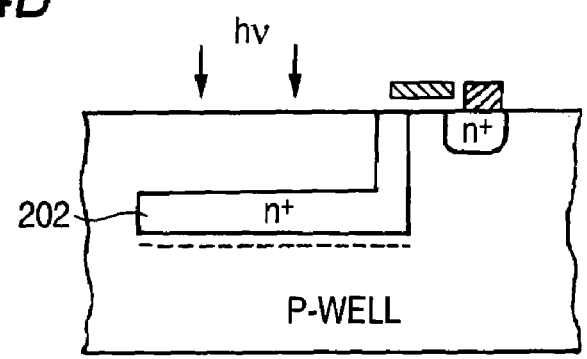
Figure 24C:
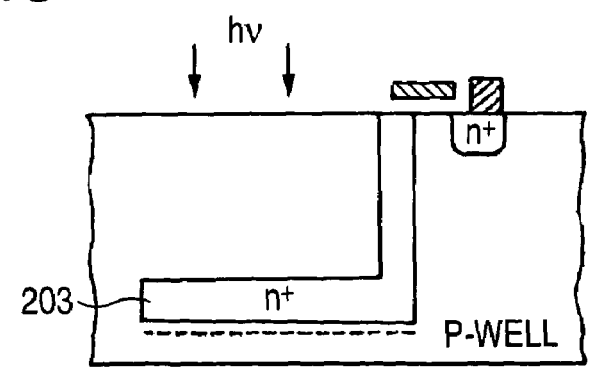

FIG. 22 is a cross-sectional view of one unit pixel (light-receiving section) of a color solid-state image pickup device according to a fourth embodiment of the invention. The present embodiment is identical in basic configuration with the first and second embodiments. The present embodiment differs from these embodiments in that a microlens 60 is stacked on each of the light-receiving sections. Specifically, two or more signal electric charge storage sections ($N^+$ layers) of one light-receiving section correspond to a one on-chip light gathering optical system; that is, the microlens 60 and one opening 61a of a light-shielding film 61. When an interlayer lens is provided, the lens is provided so as to correspond to one light-receiving section.

In contrast with the related-art image pickup device, in the present embodiment, one light-receiving section can output signals of two pixels from among R, G, and B or all pixels (i.e., three pixels). Hence, even when the area of the light-receiving section has been essentially enlarged to double or triple, a substantially identical resolution is obtained for a given CCD size. In other words, the diameter of the microlens 60 and the dimension of the opening 61a of the light-shielding film can be increased. An increase in the number of pixels derived from miniaturization is facilitated. Moreover, a loss of incident light is reduced, thereby improving shading and enhancing sensitivity and image quality.

The previous embodiments have described either the square grid arrangement of pixels or the so-called honeycomb arrangement in which pixels are shifted by a half pitch in both vertical and horizontal directions. Needless to say, the embodiments can be applied to a structure which assumes another pixel arrangement.

According to the invention, one light-receiving section can detect two or more color signal components. Hence, incident light can be effectively converted into an electric signal. Moreover, signal processing is performed through use of color signal components obtained by one or two light-receiving sections, thereby enabling reproduction of colors of a visible image. A false signal or color moiré, which would otherwise be caused by a mosaic filter of a related-art solid-state image pickup device of a single plate type, can be caused to mitigate or eliminated. Moreover, two or more color signals can be independently extracted from a single pixel without affecting an arrangement and areas in a two-dimensional plane in a related-art CCD, such as a light-receiving section and a charge transfer path.

The present invention obviates a necessity for a color filter, thereby simplifying manufacturing processes and attaining a high yield. Moreover, a light attenuation due to a color filter layer does not arise. Hence, high sensitivity can be achieved. Furthermore, a problem of deterioration of image quality, which would otherwise be caused by graininess of a color filter layer (e.g., a pigment-based color filter) or fading (of a dye-based color filter), does not arise.

What is claimed is:

1. A CCD color solid-state image pickup device comprising:
    a plurality of light-receiving sections arranged in an array on the surface of a semiconductor substrate; and a vertical transfer path by way of which signal electric charges stored in electric charge storage sections of the respective light-receiving sections are read and transferred to a horizontal transfer path, wherein the electric charge storage section of each of the light-receiving sections has a plurality of electric charge storage layers which are formed in a silicon layer and are provided in a depthwise direction of the semiconductor substrate with potential barriers interposed therebetween; and signal electric charges stored in the respective electric charge storage layers are read independently to the vertical transfer path, wherein each of the plurality of electric charge storage layers is different in the depthwise direction from the others of the plurality of electric charge storage layers, and wherein a first light-receiving section for storing blue (B) and green (G) signal electric charges and a second light-receiving section for storing green (G) and red (R) signal electric charges are alternately provided as the light-receiving sections on the surface of the semiconductor substrate;

the first light-receiving section is provided with a first electric charge storage layer for storing blue (B) signal electric charges and a second electric charge storage layer for storing green (G) signal electric charges; and the second light-receiving section is provided with the second electric charge storage layer for storing green (G) signal electric charges and a third electric charge storage layer for storing red (R) signal electric charges.

2. The CCD color solid-state image pickup device according to claim 1, wherein an electric charge path, which causes electric charges stored in the electric charge storage layers to migrate to the surface of the semiconductor substrate and is formed from a heavily-doped impurity region, is provided in an electric charge storage layer from among the plurality of electric charge storage layers, the electric charge storage layer being provided in the semiconductor substrate.

3. The CCD color solid-state image pickup device according to claim 1, wherein a concentration gradient is imparted such that the dopant concentration of the electric charge storage layers formed as heavily-doped impurity regions and the dopant concentration of an electric charge path continually connected to an electric charge storage layer increase as the electric charge storage layer and the electric charge path approach the vertical transfer path.

4. The CCD color solid-state image pickup device according to claim 1, wherein the depths of the respective electric charge storage layers are set in accordance with wavelengths of incident light to be detected.

5. The CCD color solid-state image pickup device according to claim 1, wherein the depth of the first electric charge storage layer ranges from 0.2 to 0.4 µm; the depth of the second electric charge storage layer ranges from 0.4 to 0.8 µm; and the depth of the third electric charge storage layer ranges from 0.8 to 2.5 µm.

6. The CCD color solid-state image pickup device according to claim 1, wherein on-chip light gathering optical systems are provided on upper portions of the respective light-receiving sections, and one opening of each light-shielding film corresponds to one of the light-receiving sections.

7. The CCD color solid-state image pickup device according to claim 1, wherein the light-receiving sections are arranged in a square grid pattern on the surface of the semiconductor substrate.

8. A CCD color solid-state image pickup device comprising:

a plurality of light-receiving sections arranged in an array on the surface of a semiconductor substrate; and a vertical transfer path by way of which signal electric charges stored in electric charge storage sections of the respective light-receiving sections are read and transferred to a horizontal transfer path, wherein the electric charge storage section of each of the light-receiving sections has a plurality of electric charge storage layers which are formed in a silicon layer and are provided in a depthwise direction of the semiconductor substrate with potential barriers interposed therebetween; and signal electric charges stored in the respective electric charge storage layers are read independently to the vertical transfer path, wherein each of the plurality of electric charge storage layers is different in the depthwise direction from the others of the plurality of electric charge storage layers, wherein an electric charge path, which causes electric charges stored in the electric charge storage layers to migrate to the surface of the semiconductor substrate and is formed from a heavily-doped impurity region, is provided in an electric charge storage layer from among the plurality of electric charge storage layers, the electric charge storage layer being provided in the semiconductor substrate, and wherein a first light-receiving section for storing blue (B) and green (G) signal electric charges and a second light-receiving section for storing green (G) and red (R) signal electric charges are alternately provided as the light-receiving sections on the surface of the semiconductor substrate;

the first light-receiving section is provided with a first electric charge storage layer for storing blue (B) signal electric charges and a second electric charge storage layer for storing green (G) signal electric charges; and the second light-receiving section is provided with the second electric charge storage layer for storing green (G) signal electric charges and a third electric charge storage layer for storing red (R) signal electric charges.

9. A CCD color solid-state image pickup device comprising:

a plurality of light-receiving sections arranged in an array on the surface of a semiconductor substrate; and a vertical transfer path by way of which signal electric charges stored in electric charge storage sections of the respective light-receiving sections are read and transferred to a horizontal transfer path, wherein the electric charge storage section of each of the light-receiving sections has a plurality of electric charge storage layers which are formed in a silicon layer and are provided in a depthwise direction of the semiconductor substrate with potential barriers interposed therebetween; and signal electric charges stored in the respective electric charge storage layers are read independently to the vertical transfer path, wherein each of the plurality of electric charge storage layers is different in the depthwise direction from the others of the plurality of electric charge storage layers, wherein a concentration gradient is imparted such that the dopant concentration of the electric charge storage layers formed as heavily-doped impurity regions and the dopant concentration of an electric charge path continually connected to an electric charge storage layer increase as the electric charge storage layer and the electric charge path approach the vertical transfer path, and wherein a first light-receiving section for storing blue (B) and green (G) signal electric charges and a second light-receiving section for storing green (G) and red (R) signal electric charges are alternately provided as the light-receiving sections on the surface of the semiconductor substrate;

the first light-receiving section is provided with a first electric charge storage layer for storing blue (B) signal electric charges and a second electric charge storage layer for storing green (G) signal electric charges; and the second light-receiving section is provided with the second electric charge storage layer for storing green (G) signal electric charges and a third electric charge storage layer for storing red (R) signal electric charges.

* * * * *